US010678046B2

(12) United States Patent
Ghahremani et al.

(10) Patent No.: US 10,678,046 B2
(45) Date of Patent: Jun. 9, 2020

(54) PACKAGES FOR MICROELECTROMECHANICAL SYSTEM (MEMS) MIRROR AND METHODS OF MANUFACTURING THE SAME

(71) Applicant: Infineon Technologies AG, Neubiberg (DE)

(72) Inventors: Cyrus Ghahremani, Regensburg (DE); Horst Theuss, Wenzenbach (DE)

(73) Assignee: Infineon Technologies AG (DE)

(*) Notice: Subject to any disclaimer, the term of this patent is extended or adjusted under 35 U.S.C. 154(b) by 106 days.

(21) Appl. No.: 15/959,628

(22) Filed: Apr. 23, 2018

(65) Prior Publication Data
US 2019/0293923 A1     Sep. 26, 2019

Related U.S. Application Data

(60) Provisional application No. 62/645,867, filed on Mar. 21, 2018.

(51) Int. Cl.
| *G02B 26/08* | (2006.01) |
| *B81B 7/00* | (2006.01) |
| *B81C 1/00* | (2006.01) |
| *G01S 7/486* | (2020.01) |
| *G02B 26/10* | (2006.01) |

(Continued)

(52) U.S. Cl.
CPC .......... *G02B 26/0833* (2013.01); *B81B 7/007* (2013.01); *B81C 1/00269* (2013.01); *G01S 7/4817* (2013.01); *G01S 7/4868* (2013.01); *G02B 26/105* (2013.01); *G02B 27/0006* (2013.01)

(58) Field of Classification Search
CPC ............ G02B 26/0833; G02B 27/0006; G02B 26/105; G01S 7/4817; G01S 7/4868; B81C 1/00269; B81B 7/007
See application file for complete search history.

(56) References Cited

U.S. PATENT DOCUMENTS

| 9,933,615 B2 * | 4/2018 | Uchiyama ............ H04N 9/3114 |
| 2002/0050744 A1 | 5/2002 | Bernstein et al. |
| 2003/0085867 A1 | 5/2003 | Grabert |

(Continued)

FOREIGN PATENT DOCUMENTS

| DE | 10 2011 120660 A1 | 5/2013 |
| EP | 1688776 A1 | 8/2006 |
| EP | 1748029 A2 | 1/2007 |

*Primary Examiner* — Euncha P Cherry
(74) *Attorney, Agent, or Firm* — Design IP

(57) ABSTRACT

A microelectromechanical system (MEMS) package assembly and a method of manufacturing the same are provided for Light Detection and Ranging (LIDAR) systems. A MEMS package assembly includes a MEMS chip including a front-side surface and a back-side surface, the MEMS chip further including a LIDAR MEMS mirror configured to receive light and reflect the light as reflected light; and a cavity cap disposed on the front-side surface of the MEMS chip and forms a cavity that surrounds the LIDAR MEMS mirror such that the LIDAR MEMS mirror is sealed from an environment, the cavity cap having an asymmetrical shape such that a transmission surface of the cavity cap, through which the light and the reflected light is transmitted, is tilted at a tilt angle with respect to the front-side surface of the MEMS chip.

21 Claims, 26 Drawing Sheets

(51) Int. Cl.
   *G01S 7/481*      (2006.01)
   *G02B 27/00*      (2006.01)

(56)          References Cited

U.S. PATENT DOCUMENTS

2007/0024549 A1* 2/2007 Choi .................... B81B 7/0067
                                                    345/84
2008/0290489 A1* 11/2008 Cheng ................. B81B 7/0067
                                                    257/680
2010/0014147 A1   1/2010 Pinter
2010/0330332 A1* 12/2010 Quenzer ............... B81B 7/0067
                                                    428/141
2012/0140306 A1   6/2012 Pinter
2015/0040368 A1   2/2015 Quenzer et al.
2017/0146792 A1   5/2017 Straub et al.
2018/0059406 A1*  3/2018 Torkkeli ............... G01S 7/4817

* cited by examiner

PACKAGES FOR MICROELECTROMECHANICAL SYSTEM (MEMS) MIRROR AND METHODS OF MANUFACTURING THE SAME

CROSS REFERENCE TO RELATED APPLICATIONS

This application claims the benefit of U.S. Provisional Patent Application No. 62/645,867 filed Mar. 21, 2018, which is incorporated by reference as if fully set forth.

FIELD

The present disclosure relates generally to devices and methods related to integrated optical systems, and, more particularly, to a tilted chip assembly used in optical systems.

BACKGROUND

Light Detection and Ranging (LIDAR), is a remote sensing method that uses light in the form of a pulsed laser to measure ranges (variable distances) to an object. In particular, light is transmitted towards the object and the time it takes to return to its source is measured. This is also referred to as measuring time-of-flight (TOF).

LIDAR sensors are an essential element in future fully autonomous or semi-autonomous self-driving cars. The system operates on the principle of TOF measurement. A very short laser pulse is transmitted, hits an object, is reflected and detected by a sensor. From the time-of-flight of the laser beam it is possible to calculate the distance to the object. Scanning LIDAR systems scan the surroundings of the car horizontally with a laser beam across a certain angular segment and produce a three-dimensional (3D) map of the environment. Conventional systems use rotating mirrors which are not integrated on chip level. Some solutions make use of several laser diodes mounted one on top of the other to extend the vertical field of view.

In LIDAR systems, packaging of the MEMS chip should reduce or eliminate static reflection back onto the MEMS micro-mirror that would otherwise cause inaccuracies, including a "blurring" in the return image caused by "ghost" beams.

SUMMARY

A microelectromechanical system (MEMS) package assembly and a method of manufacturing the same are provided.

A MEMS package assembly includes a MEMS chip including a front-side surface and a back-side surface, the MEMS chip further including mirror configured to receive light and reflect the light as reflected light; and a cavity cap disposed on the front-side surface of the MEMS chip and forms a cavity that surrounds the mirror such that the mirror is sealed from an environment, the cavity cap having an asymmetrical shape such that a transmission surface of the cavity cap, through which the light and the reflected light is transmitted, is tilted at a tilt angle with respect to the front-side surface of the MEMS chip.

According to one or more embodiments, a method of manufacturing a plurality of MEMS packages includes bonding a front-side of a MEMS wafer to a glass cavity wafer to form a bonded wafer structure. The MEMS wafer includes a plurality of MEMS chips each having a mirror exposed at the front-side of a MEMS wafer. The glass cavity wafer has a plurality of asymmetric portions that have a transmission surface tilted at a tilt angle from a bonding surface, and each of the plurality of asymmetric portions define a cavity of a plurality of cavities. The MEMS wafer and the glass cavity wafer are aligned such that each mirror resides in a different one of the plurality of cavities. The method of manufacturing further includes dicing the bonded wafer structure into the plurality of MEMS packages, each including one of the plurality of MEMS chips.

BRIEF DESCRIPTION OF THE DRAWINGS

Embodiments are described herein making reference to the appended drawings.

DETAILED DESCRIPTION

Figure 1:
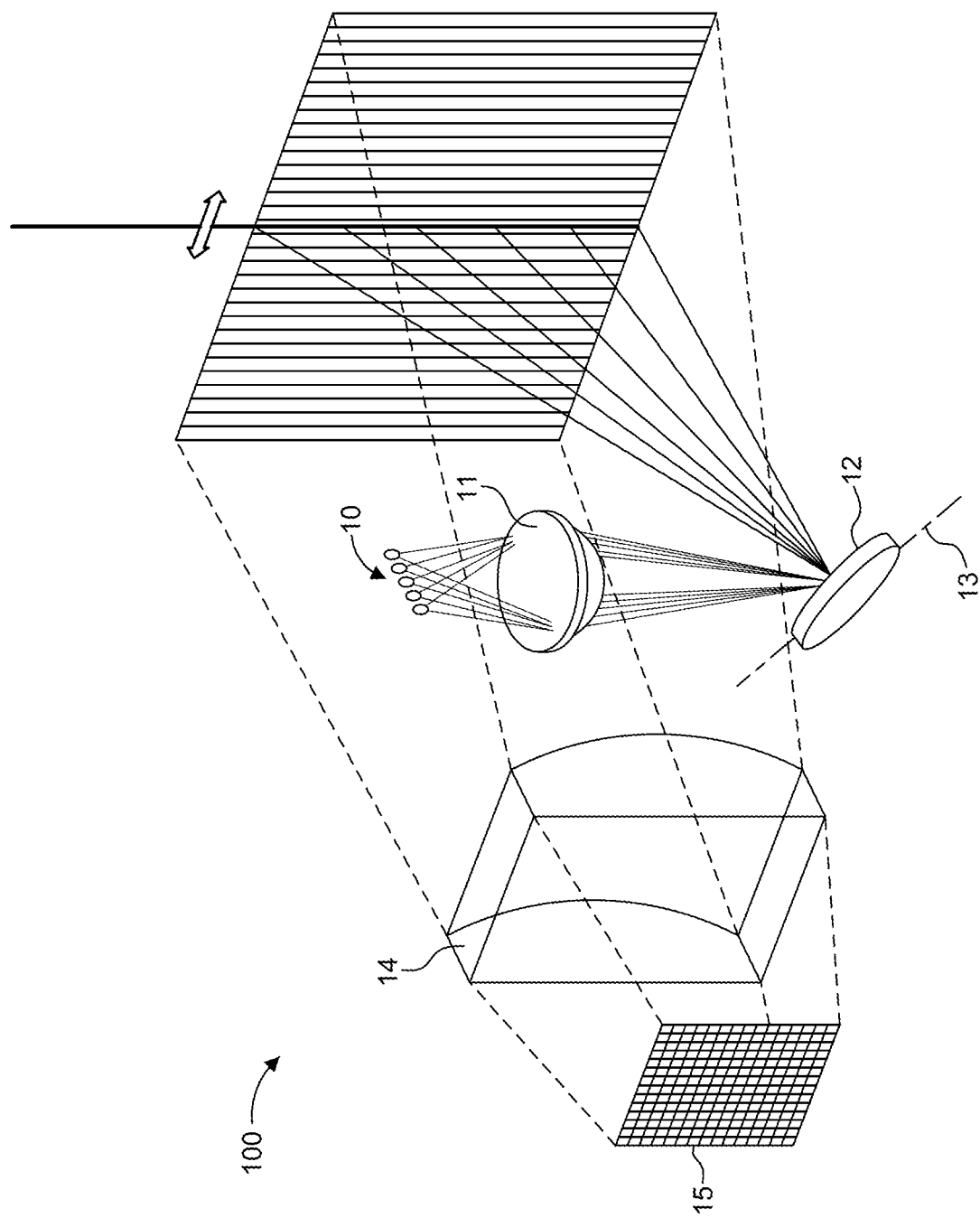
FIG. 1 illustrates a schematic view of a Light Detection and Ranging (LIDAR) scanning system in accordance with one or more embodiments.
Figure 2A:
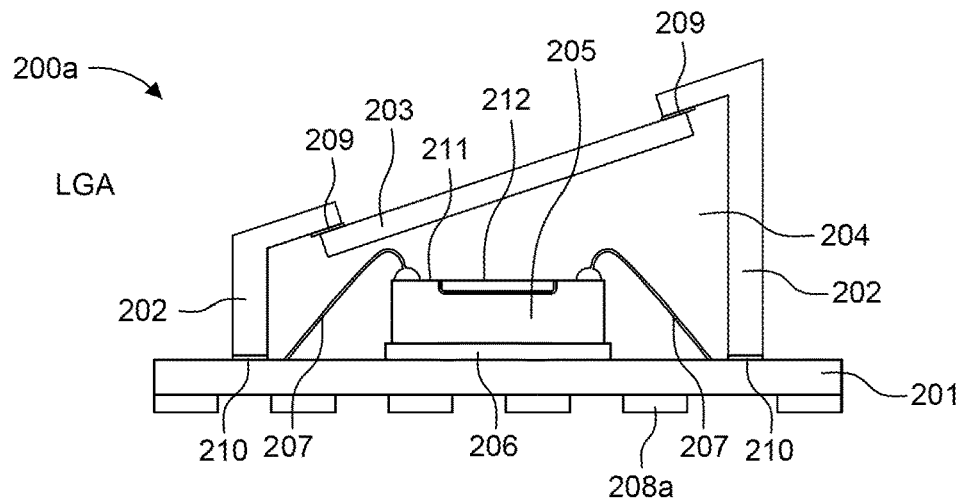
FIGS. 2A-2E show cross-sectional diagrams of package assemblies in accordance with one or more embodiments.
Figure 2B:
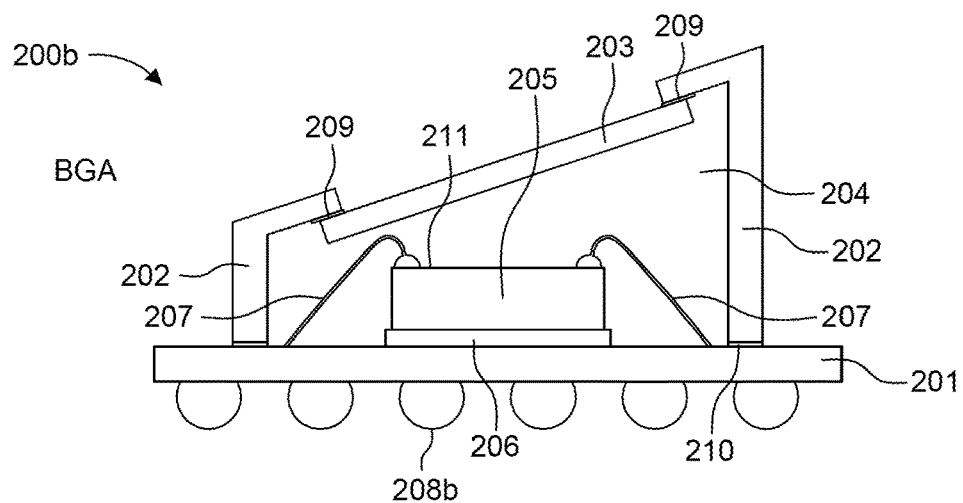
Figure 2C:
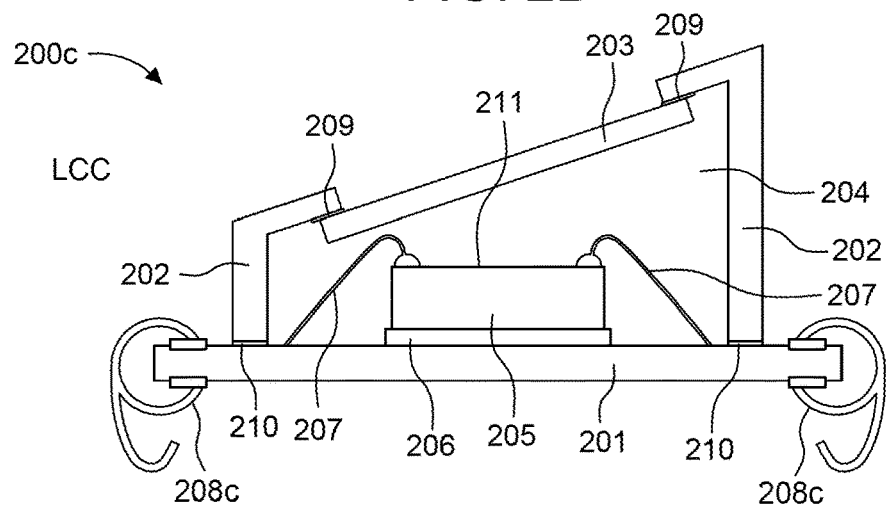
Figure 2D:
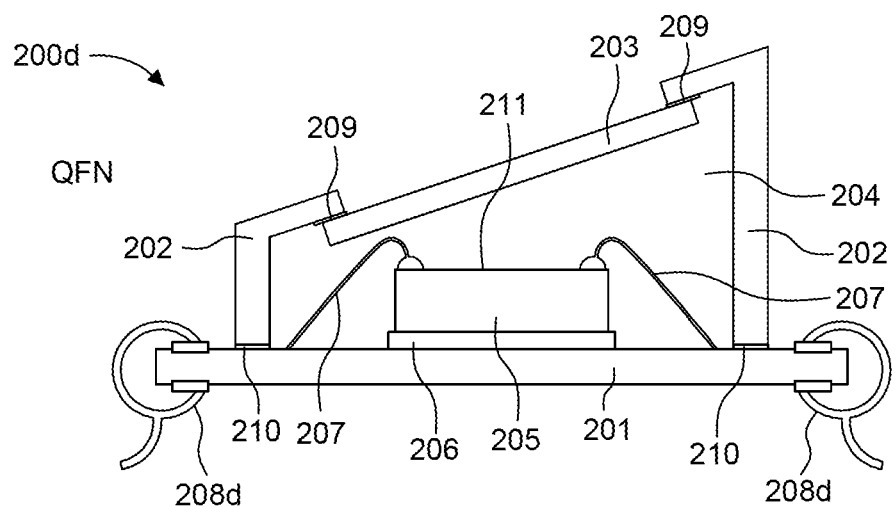
Figure 2E:
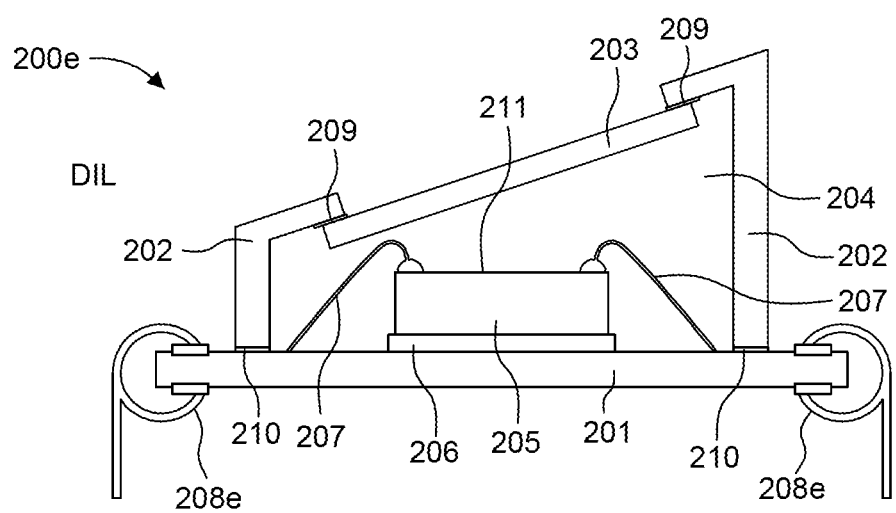

In the following, various embodiments will be described in detail referring to the attached drawings. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to optical sensors and optical sensor systems and to obtaining information about optical sensors and optical sensor systems. A sensor may refer to a component which converts a physical quantity to be measured to an electric signal, for example a current signal or a voltage signal. The physical quantity may, for example, comprise electromagnetic radiation, such as visible light, infrared (IR) radiation, or other type of illumination signal, a current, or a voltage, but is not limited thereto. For example, an image sensor may be a silicon chip inside a camera that converts photos of light coming from a lens into voltages. The larger the active area of the sensor, the more light that can be collected to create an image.

A sensor device as used herein may refer to a device which comprises a sensor and further components, for example biasing circuitry, an analog-to-digital converter or a filter. A sensor device may be integrated on a single chip, although in other embodiments a plurality of chips or also components external to a chip may be used for implementing a sensor device.

FIG. 1 illustrates a Light Detection and Ranging (LIDAR) scanning system 100 in accordance with one or more embodiments. The LIDAR scanning system 100 includes a transmitter, including laser sources 10, a first optical component 11 and a one-dimensional (1D) MEMS mirror 12, and a receiver, including a second optical component 14 and a two-dimensional (2D) detector array 15. The MEMS mirror 12 is a mechanical moving mirror (i.e., a MEMS micro-mirror) integrated on a semiconductor chip (not shown).

The laser sources 10 are linearly aligned in single bar formation and are configured to transmit light used for scanning an object. The light transmitted from the laser sources 10 are directed towards the first optical component 11 configured to focus each laser onto a one-dimensional MEMS mirror 12. The first optical component 11 may be, for example, a lens. When reflected by the MEMS mirror 12, the light from the laser sources 10 are aligned vertically to form a vertical scanning line. The MEMS mirror 12 is configured to oscillate "side-to-side" about a scanning axis 13 such that the light reflected from the MEMS mirror 12 (i.e., the vertical scanning line) oscillates back and forth in a horizontal scanning direction. The MEMS mirror 12 may be integrated on a MEMS chip (i.e., a MEMS device) which may be assembled in a chip package, to be further described below.

Upon impinging one or more objects, the transmitted light is reflected back towards the LIDAR scanning system 100 where the second optical component 14 (e.g., a lens) receives the reflected light. The second optical component 14 directs the reflected light onto the detector array 15 that is configured to generate measurement signals used for generating a 3D map of the environment based on the reflected light (e.g., via TOF calculations and processing). For example, the detector array 15 may be an array of photodiodes or other light detection component capable of detecting and measuring light and generating electric signals therefrom.

According to one or more embodiments, an integrated optical system is provided with a package assembly or chip assembly. The package assembly or chip assembly may be incorporated in a chip package and may be used in LIDAR applications. For example, the package assembly may be provided to reduce optical effects (e.g., static reflection) inside the package that would otherwise be caused by light reflected by a microelectromechanical system (MEMS) micro-mirror integrated with the chip, disposed within the package.

In particular, the package assembly may be used with a tilted protective cover (e.g., glass) arranged over a MEMS micro-mirror. The glass may be tilted between 5°-30° with respect to a substrate ground plane or the MEMS chip surface in order to reduce the amount of light reflected off the back side of the cover back onto the MEMS micro-mirror, referred to as static reflection. However, other tilt angles are possible. By reducing or eliminating the static reflection, ghost beams and blurring of the image can be avoided.

While various embodiment are described herein, each embodiment includes one or more of the following features: a cavity package (i.e., a package that includes a cavity) to enable oscillation of MEMS mirror; an optical lid which allows for incoming and reflected light beams; low stress assembly; sealing quality of the cavity; and avoidance of static reflections. In addition, it can be appreciated that each MEMS device provided herein includes a MEMS optical component (e.g., the MEMS mirror) but may not be shown in all instances for simplicity. In those cases where the MEMS optical component is not shown, it can be assumed that the optical component, placement, and functionality is substantially the same as other optical components shown in other figures.

With regard to the low stress assembly, the MEMS mirror chip contains sensitive structures (e.g., springs and trenches forming respective actuators, etc.). Pressure induced mechanical stress lowers oscillation quality and performance of the system. Thus, reducing the mechanical stress on the MEMS mirror chip (e.g., during assembly or caused by the final package assembly), may enhance the operation of the MEMS mirror chip.

With regard to the sealing quality of the cavity, different methods may be used to seal the MEMS mirror chip inside the cavity to ensure varying degrees of particle protection, avoidance of condensation forming inside the cavity (e.g., on the MEMS mirror or on the inside of the cover), and/or avoidance of freezing of humidity, including non-hermetic, near-hermetic, or full-hermetic sealing.

A variety of package technologies and materials are conceivable. For example, package technologies include land gird array (LGA), ball grid array (BGA), leadless chip carrier (LCC), ceramic leadless chip carrier (CLCC), quad flat no-lead (QFN), leadless QFN, dual in-line (DIL), low-profile fine-pitch ball grid array (LFBGA), DSOF, TO, etc., but at not limited thereto. These package types and other surface mount devices (SMDs) may differ in their sealing quality (hermetic or nearly hermetic packages are more "safe" with respect to humidity diffusion from the environment into the cavity).

Conceivable packages may include or differ by one or more of the following variants: different substrates (e.g., metal (leadframe), ceramic, organic (similar to printed circuit board (PCB) material)), and different optical lids or covers (e.g., optical material of glass, silicon, sapphire, etc.). Furthermore, the optical lids or covers may be cavity-forming caps, may be integrated into a frame (e.g., a metal frame), or assembled onto a pre-mold cavity or a ceramic cavity.

One or more methods (e.g., adhesive bonding, gluing, soldering, welding, and the like) or one or more different materials (e.g., silicone, glass solder, AuSn, and the like) may be used to bond one or more elements together (e.g., joining cap or lid to substrate). It will be appreciated that bonding methods may be interchangeable across various embodiments disclosed herein.

Alternatively, a wafer-level approach may be used such that a cavity-shaped lid may be directly mounted onto the MEMS chip (or even on wafer-level prior to singulation). Here, if the lid attachment leaves the electrical pads exposed, the sub-mount chip/lid can further be processed into a package using molding or casting processes.

Furthermore, one or more techniques may be used for making electrical connections to the MEMS mirror chip, including through-hole techniques (e.g., through-silicon vias (TSVs)), redistribution layers (RDLs), etc., but are not limited thereto.

FIGS. 2A-2E show cross-sectional diagrams of examples of a MEMS package assemblies 200a-200e in accordance with one or more embodiments. Specifically, the MEMS package assemblies 200a-200e include a chip carrier, a glass cap, and a non-hermetic laminate substrate and are LGA, BGA, LCC, QFN, and DIL SMDs, respectively. Each MEMS package assembly 200a-200e may be referred to as an optical package and includes a substrate 201, an encapsulation component 202 (e.g., plastic), and a glass substrate 203 that make up the packaging of the sensor package 200a-200e, where there glass substrate 203 may be a glass cover, a glass lid, or the like. The glass substrate 203 may be referred to as a transmission surface, transmission substrate, transmission lid, transmission window, transmission cap, or transmission cover that is configured to bidirectionally transmit light therethrough. In addition, the above uses of "transmission" may be replaced with "optical." In addition, as used herein, "transmission" may include both receiving and transmitting light, including the receiving and transmitting light through an object such as the glass substrate 203. The substrate 201, encapsulation component 202, and the glass substrate 203 are arranged such that a cavity 204 is formed around a MEMS device 205.

The MEMS devices 205 is an optical chip with a MEMS mirror that oscillates about the scanning axis orthogonal to the viewing plane of FIG. 2 (i.e., oscillates forward and back, into and out of the page). Said differently, the MEMS mirror oscillates orthogonal to the tilt plane of glass substrate. The MEMS device 205 may be referred to as a die or a chip with an integrated MEMS. The packaging itself may be referred to as a chip carrier package or and a package substate may be referred to as a chip carrier.

In addition, the encapsulation component 202 and the glass substrate 203 are formed such that the glass substrate 203 is formed at an angle of 5-30° with respect to a main surface (e.g., upper surface) of the substrate 201. For example, the encapsulation component 202 may be shorter on one side and longer on an opposing side such that the glass substrate 203, laid across on the one side to the opposing side, is tilted at an angle.

Inside the packaging, in the cavity 204, the MEMS device 205 is bonded to the substrate 201 by a die attach layer 206 (e.g., a glue such as silicone).

The substrate 201 may be, for example, a leadframe, a laminate substrate (e.g., a printed circuit board (PCB) or the like), or a ceramic base plate that includes electrically conductive paths from bonding wires 207 to an electrical interface 208 external to the package assembly 200a-200e. The electrically conductive paths may include bond pads, RDLs, and/or vias to provide electrical connections to the bonding wires 207 and the electrical interface 208. The electrical interface 208 may be either solder pads 208a, solder balls 208b, J leads 208c, gull wings 208d, or leads 208e, respectively. For example, the solder balls 208b are bonded to the pads on the bottom of the chip package 200 for connecting the chip package 200 to a circuit board (e.g., a PCB) or the like. Thus, the bonding wires 207 and solder balls 208b carry electrical signals between the integrated circuit on a chip and an external device (via the PCB).

It will be appreciated that while embodiments herein describe one or more types of chip packaging, these are merely examples and the embodiments are not limited thereto. Thus, other types of integrated circuit (IC) packaging, materials and configurations may be used, some of which will be further described below.

The glass substrate 203 is bonded to the encapsulation component 202 by a glue 209. Similarly, the encapsulation component 202 is bonded to the substrate by a glue 210. The glues 209 and 210 may be silicone or other type of adhesive. If the encapsulation component 202 is metal, such as a nickel-iron alloy (NiFe), glue 209 may be glass solder and glue 210 may be glass solder or metallic solder.

The encapsulation component 202 forms part of a protective housing around at least part of the MEMS device 205 and may be a metal, plastic (e.g., mold resin), glass or ceramic casing. The encapsulation component 202 may also be referred to as a package housing.

The glass substrate 203 is a plane of glass, such as a glass cover or lid, disposed on, under, or bonded to the encapsulation component 202 and is adhered thereto by an adhesive glue. The glass substrate 203 forms an upper portion of the protective housing and is arranged over the MEMS device 205 such that the MEMS device 205 is enclosed within the packaging inside cavity 204. The glass substrate 203, as well as the package as a whole, protects the MEMS device 205 from the outside environment.

While a glass substrate 203 is used in this example, other transparent materials that permit the transmission of light therethrough may also be used. Thus, the glass substrate 203 may generally be referred to as a transparent plate. Furthermore, the glass substrate 203 may be coated on both sides with an antireflective coating to reduce reflections of light (e.g., light from the laser sources) and to filter out light in undesired spectrums (e.g., light from the environment).

The MEMS device 205 may be a semiconductor chip or die that has a MEMS component such as a MEMS mirror 212 integrated therewith. The MEMS mirror 212 may be a silicon-based solid-state MEMS micro-mirror integrated onto the chip. The MEMS mirror 212 is arranged at an upper (main) surface 211 of the chip such that it can receive and reflect light received through the glass plate 203. The MEMS mirror 212 is coupled to the chip at pivot points that are aligned on a scanning axis such that the MEMS mirror 212 is configured to move about the scanning axis that extends parallel to the upper surface 211. For example, the MEMS mirror 212 may be controlled to oscillate back and forth about the scanning axis to perform a horizontal scanning operation.

The MEMS device 205 further includes an integrated circuit for controlling the movement (e.g., the oscillation) of the MEMS mirror 212, and may receive or transmit electric signals via the bonding wires 207. For example, the integrated circuit may include a microprocessor that is configured to control a driver of the MEMS mirror 212 according to a protocol and/or according to control signals received from an external device via the bonding wires 207. For example, an on/off state, a range of movement (e.g., an oscillation range between +/−30° about the axis) and an oscillation frequency of the MEMS mirror 212 may be controlled and varied according to application by the microprocessor. In one example, the oscillation frequency may be 2-20 kHz, but is not limited thereto.

The MEMS device 205 is die attached or bonded to the substrate 201 a die attach layer 206, such as an adhesive, film, paste, epoxy, low stress glue (e.g., silicone), or the like.

The upper surface 211 of the MEMS device 205 may be referred as a first main surface. The upper surface 211 may be a planar surface and the glass substrate 203 may defining a tilt angle that is inclined with respect to the upper surface 211. In addition, the substrate includes a planar main surface proximal to the MEMS device 205 and to which the housing 202/203 is coupled. The glass substrate 203 includes a first planar surface (i.e., upper surface or front side) and a second planar surface (i.e., lower surface or backside) that define a thickness of the transparent plate.

While a main portion of light transmitted by the laser sources and received by the MEMS mirror 212 is transmitted through the glass substrate 203 via reflection from the MEMS mirror 212, a smaller, secondary portion of the light may be reflected back into the cavity 204 by the backside of the glass substrate 203. However, due to the tilt angle of the glass substrate 203 relative to the MEMS mirror 212 (i.e., to upper surface 211), the amount of light reflected back towards the MEMS device 205 by the backside of the glass substrate 203 may be reduced and system performance may be improved. That is, even though some portion of light may be reflected back into the cavity 204, the amount of light that is actually reflected back at the MEMS mirror 212 and impinges thereon may be reduced due to the tilt angle of the glass substrate 203. Thus, the inner-housing reflection may be optimized according to the tilt angle.

Figure 3:
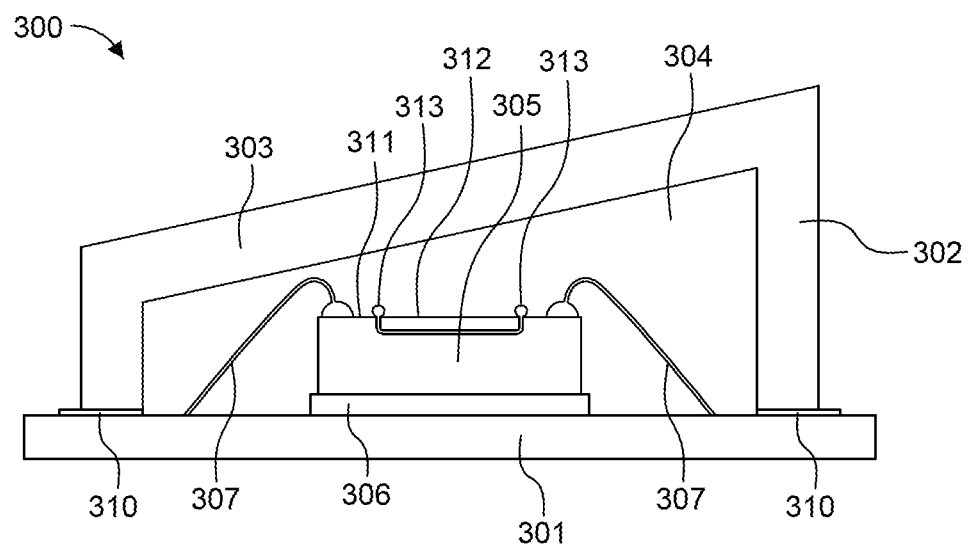
FIG. 3 shows a cross-sectional view illustrating another embodiment of a package assembly according to one or more embodiments.

FIG. 3 shows a cross-sectional view illustrating another embodiment of a package assembly 300 according to one or more embodiments. The package assembly 300 has similar features to those features shown in FIGS. 2A-2E, and is package-type generic for simplicity. However, any package type may be used.

In particular, package assembly 300 includes a chip carrier with a glass cavity cap 302 and is non-hermetic. The glass cavity cap 302 (i.e., a glass lid or encasement) is transparent lid formed as a single member that forms a cavity 304 when disposed onto a substrate 301 such that the cavity 304 surrounds the MEMS device 305 or some other optical chip that is disposed on the substrate 301. The glass cavity cap 302 has a wedge shape and thereby forms the cavity 304 that has a wedge shape. The glass cavity cap 302 is bonded to the substrate 301 by a glue 310 or other type of adhesive. The glass cavity cap 302 has an upper surface 303 that is tilted at a tilt angle with respect to the substrate 301 and the MEMS device 305. The upper surface 303 may be referred to as a transmission surface, transmission substrate, transmission lid, transmission window, transmission cap, or transmission cover that is configured to bidirectionally transmit light therethrough. In addition, the above uses of "transmission" may be replaced with "optical."

Similar to the examples shown in FIGS. 2A-2E, the package assembly 300 also includes a die attach layer 306, bonding wires 307, and a MEMS mirror 312 attached at the upper (main) surface 311 at pivot points 313. The pivot points 313 are aligned on a scanning axis such that the MEMS mirror 312 is configured to move about the scanning axis that extends parallel to the upper surface 311. For example, the MEMS mirror 312 may be controlled to oscillate back and forth (into and out of the page, orthogonal to the tilt plane of the glass cavity cap 302) about the scanning axis to perform a horizontal scanning operation.

Figure 4A:
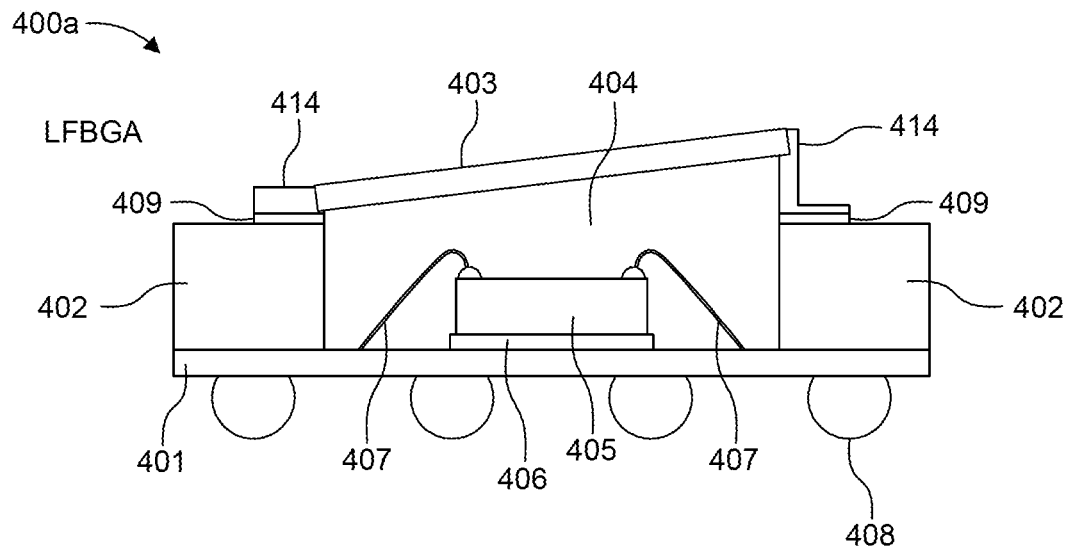
FIGS. 4A and 4B show cross-sectional views illustrating another embodiment of package assemblies according to one or more embodiments, respectively.
Figure 4B:
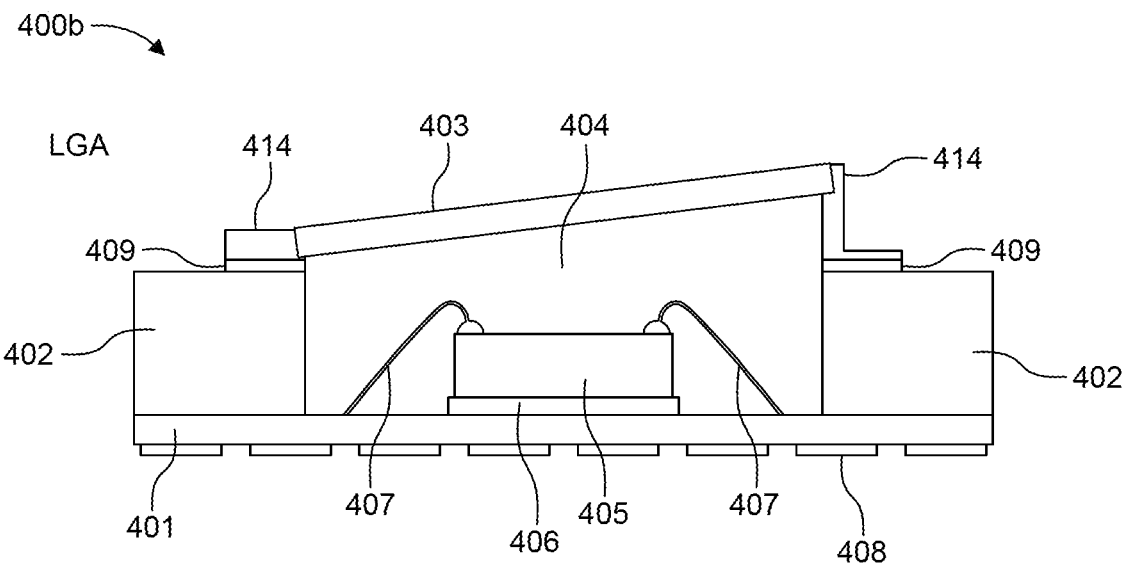

FIGS. 4A and 4B show cross-sectional views illustrating another embodiment of package assemblies 400a and 400b according to one or more embodiments, respectively. Each package assembly 400a and 400b has similar features to those features shown in the previous examples, and particularly show LFBGA and LGA type package types, respectively, but are not limited to these package types.

In particular, package assemblies 400a and 400b include a pre-molded structure and are non-hermetic. Each package assembly 400a and 400b includes a substrate 401, a glass substrate 403 (i.e., a transparent plate) that permits the passage of light to and from a MEMS mirror (not shown), a cavity 404 (e.g., filled a gas such as air having atmospheric pressure), a MEMS device 405, a die attach layer 406, bonding wires 407, and an electrical interface 408.

In addition, each package assembly 400a and 400b includes a pre-mold body 402 disposed on the substrate 401 and that surrounds the MEMS device 405. On top of the pre-mold body 402, frame structure 414 is disposed, attached by a glue or adhesive layer 409 to the pre-mold body 402. The frame structure 414 is configured or shaped, and may include angled grooves or notches, to receive and hold the glass substrate 403 at a fixed tilt angle. In particular, the frame structure 414 has a lower end (left side) that is less elevated and a higher end (right side) that is more elevated such that the glass substrate 403 is tilted and held at the tilt angle. Glue may also be used to bond the glass substrate 403 to the frame structure 414.

Figure 5A:
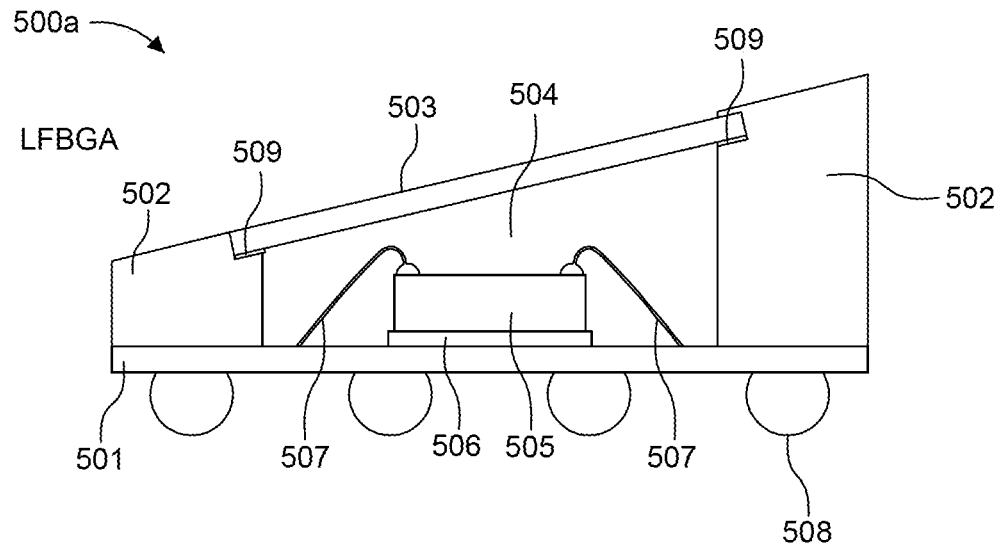
FIGS. 5A-5C show cross-sectional views illustrating another embodiment of package assemblies according to one or more embodiments, respectively.
Figure 5B:
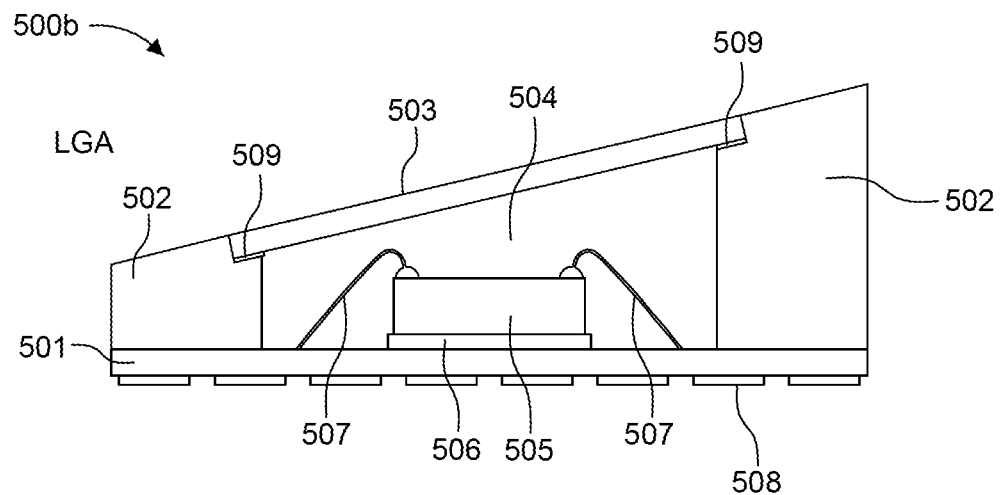
Figure 5C:
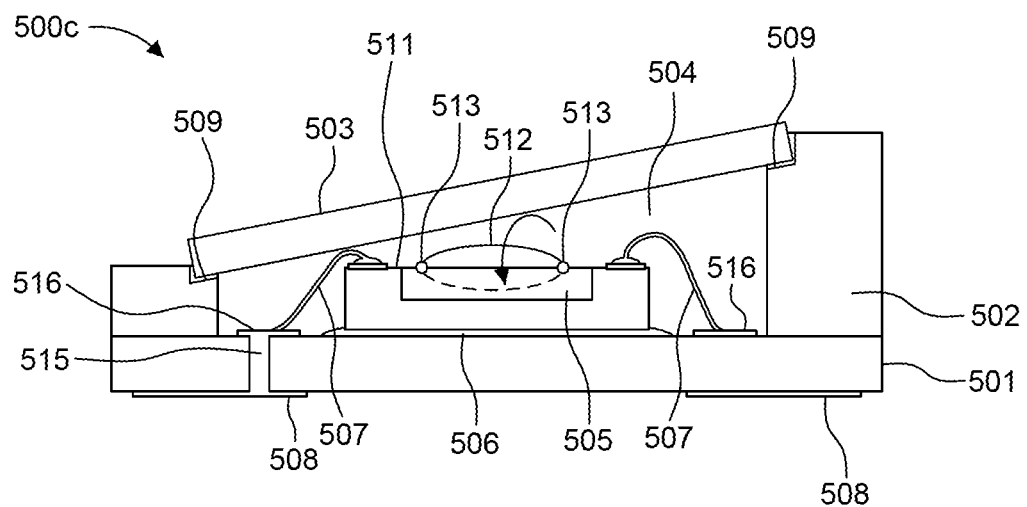

FIGS. 5A-5C show cross-sectional views illustrating another embodiment of package assemblies 500a, 500b, and 500c according to one or more embodiments, respectively. Each package assembly 500a, 500b, and 500c has similar features to those features shown in the previous examples, and package assemblies 500a and 500b particularly show LFBGA and LGA package types, respectively, but are not limited to these package types.

In particular, package assemblies 500a, 500b, and 500c include an asymmetric pre-molded structure and are non-hermetic. Each package assembly 500a, 500b, and 500c includes a substrate 501, a glass substrate 503 (i.e., a transparent plate) that permits the passage of light to and from a MEMS mirror (not shown), a cavity 504 (e.g., filled with air having atmospheric pressure), a MEMS device 505, a die attach layer 406, bonding wires 407, and an electrical interface 508.

In addition, each package assembly 500a, 500b, and 500c includes an asymmetric pre-mold body 502 disposed on the substrate 501 and that surrounds the MEMS device 505. The pre-mold body 502 is configured or shaped, and may include angled grooves or notches, to receive and hold the glass substrate 503 at a fixed tilt angle. In particular, the pre-mold body 502 has a lower end (left side) that is less elevated and a higher end (right side) that is more elevated such that the glass substrate 503 is tilted and held at the tilt angle. Glue 509 disposed in the grooves or at the inside edges of the pre-mold body 502 may also be used to bond the glass substrate 503 to the pre-mold body 502.

Additionally, FIG. 5C shows a metallization structure including one or more metal interconnects 515 (e.g., conductive vias disposed in a through-hole or via hole) that extends from a bond pad 516 inside the cavity 504, connected to a bond wire 507, to an electrical interface 508 outside the package assembly 500c.

In addition, FIG. 5C shows a MEMS mirror 512, coupled at pivot points 513. The MEMS mirror 512 is shown at a maximum degree of oscillation such that part of the MEMS mirror 512 is above the upper surface 511 and part of the MEMS mirror is below the upper surface 511 in a cavity of the MEMS device 505. Thus, the MEMS mirror 512 is controlled to oscillate back and forth (into and out of the page, orthogonal to the tilt plane of the glass substrate 503) about the scanning axis to perform a horizontal scanning operation.

FIGS. 6A-6D show cross-sectional views illustrating a process of manufacturing the package assembly 500c shown in FIG. 5C according to one or more embodiments.

Figure 6A:
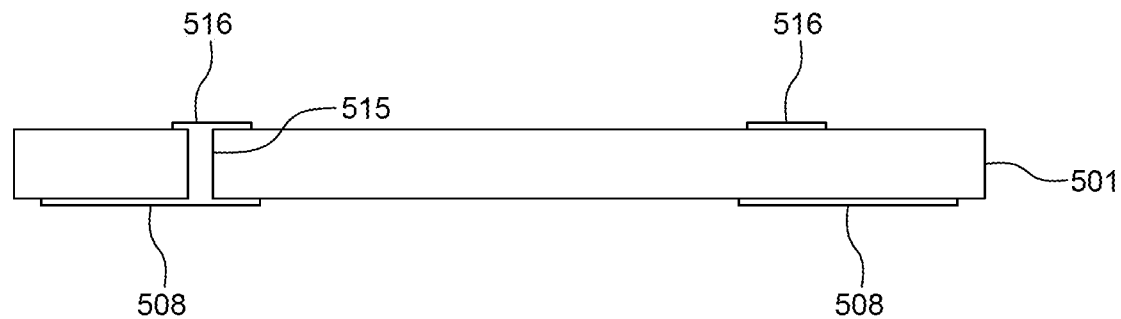
FIGS. 6A-6D show cross-sectional views illustrating a process of manufacturing the package assembly shown in FIG. 5C according to one or more embodiments.

In particular, FIG. 6A shows a formation of a substrate 501 and a metallization structure including one or more metal interconnects 515 (e.g., metal vias disposed in a through-hole) that extends from a bond pad 516 to an electrical interface 508.

Figure 6B:

FIG. 6B shows a formation of an asymmetric pre-mold body 502. The asymmetric pre-mold body 502 has microstructure (e.g., angled grooves or notches) for later fixing of a glass substrate 503.

Figure 6C:
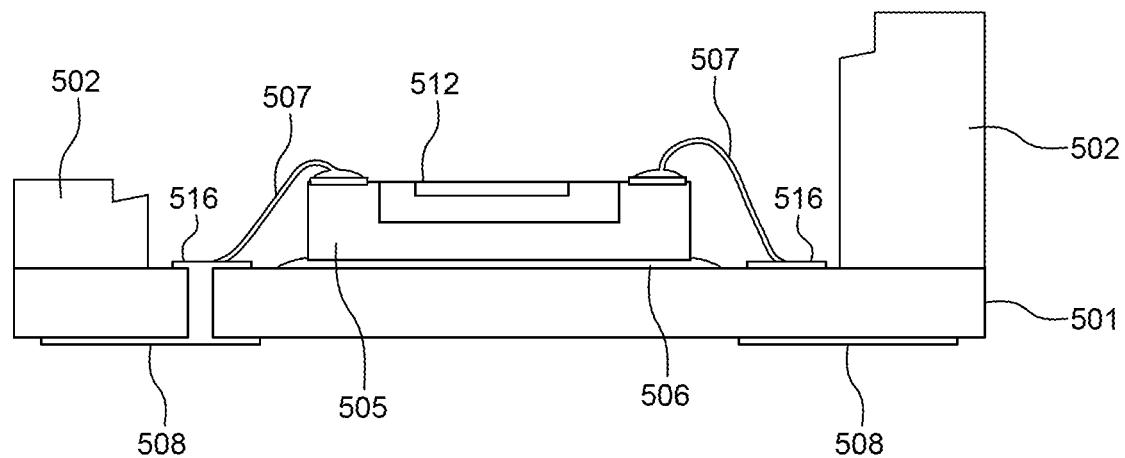

FIG. 6C shows a formation a die attach layer 506 (e.g., a soft glue to ensure low stress MEMS attachment, the placement of the MEMS device 505, and bonding of the bond wires 507.

Figure 6D:
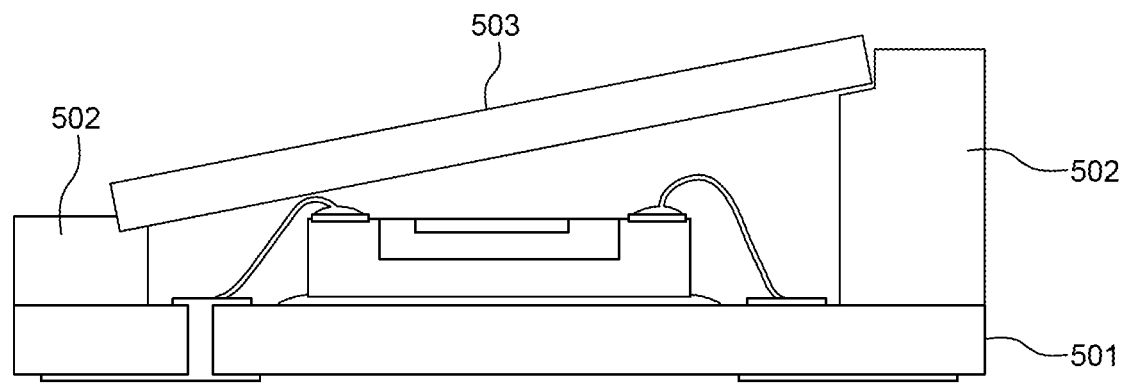

FIG. 6D shows a tilted attachment of the glass substrate 503 that serves as an optical window by gluing or by mechanical fixture (e.g., a clip). The glue may be a soft glue to ensure low stress attachment.

Figure 7:
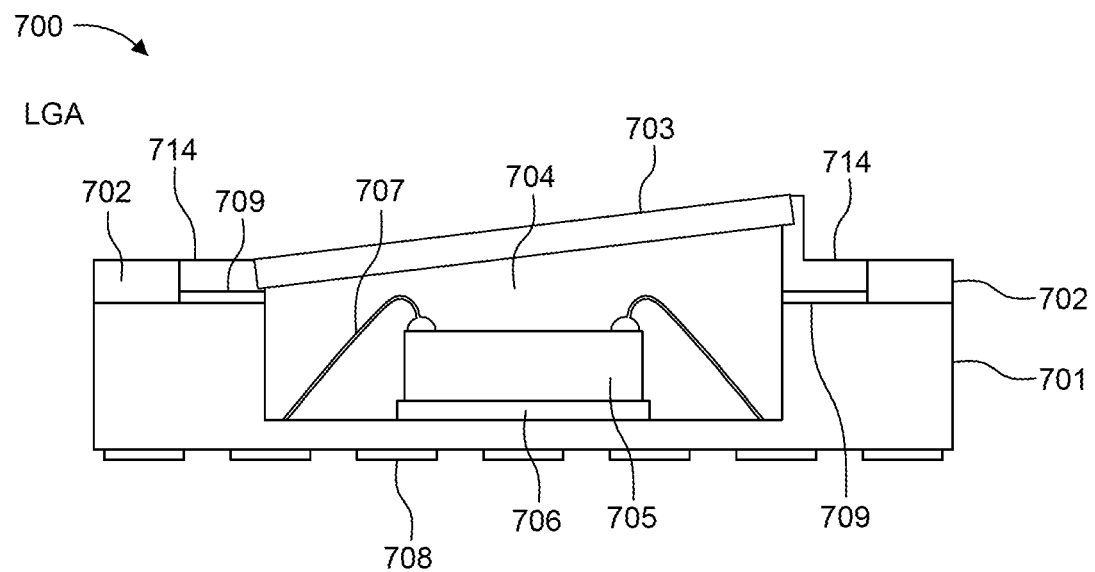
FIG. 7 shows cross-sectional view illustrating another embodiment of a package assembly according to one or more embodiments.

FIG. 7 shows cross-sectional view illustrating another embodiment of a package assembly 700 according to one or more embodiments. The package assembly 700 has similar features to those features shown in the previous examples, and particularly shows a LGA package type, but is not limited to this package type. For example, a BGA type package may also be used.

In particular, package assembly 700 is a cavity package in which the cavity 704 is primarily formed as a result of a shape of the substate 701, which forms a recess in which the MEMS device 705 is disposed. The substrate 701 may be formed of a single structure or may be formed by "stamping" multiple layers of material (e.g., PCB material) together to form the walls that surround the recess.

In addition, a pre-mold body 702 and/or a frame structure 714 may be used in a similar manner described above in other examples in order to form a support structure for the glass substrate 703 that is disposed at a fixed tilt angle.

The package assembly 700 also includes a cavity 704 (e.g., filled with air having atmospheric pressure), a MEMS device 705, a die attach layer 706, bonding wires 707, an electrical interface 708, and a bonding material 709. The bonding material 709 may be an epoxy glue if the frame structure 714 is made of plastic, or may be an epoxy glue or a glass solder if the frame structure 714 is made of metal.

Figure 8A:
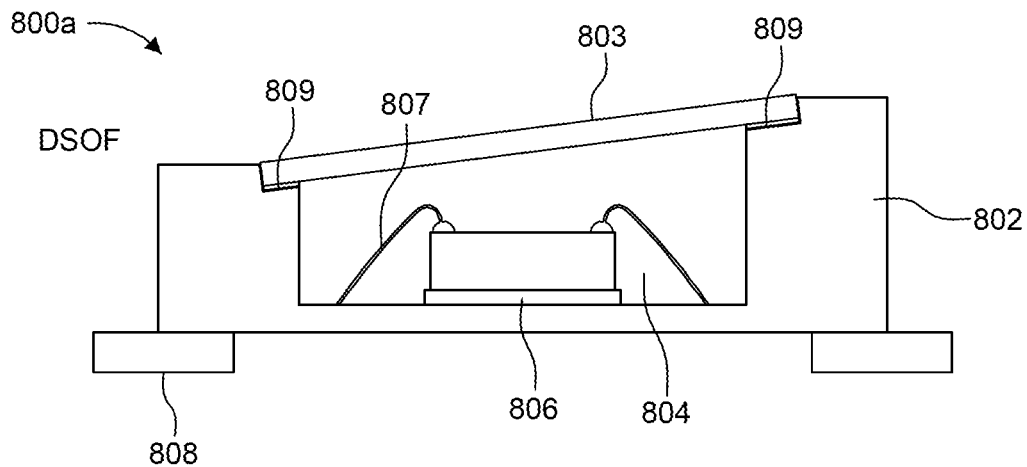
FIGS. 8A-8C show cross-sectional views illustrating another embodiment of package assemblies according to one or more embodiments.
Figure 8B:
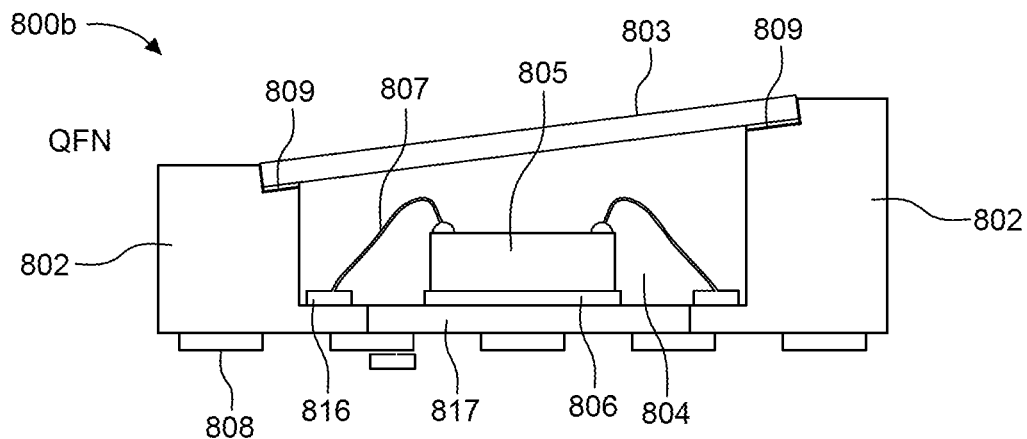
Figure 8C:
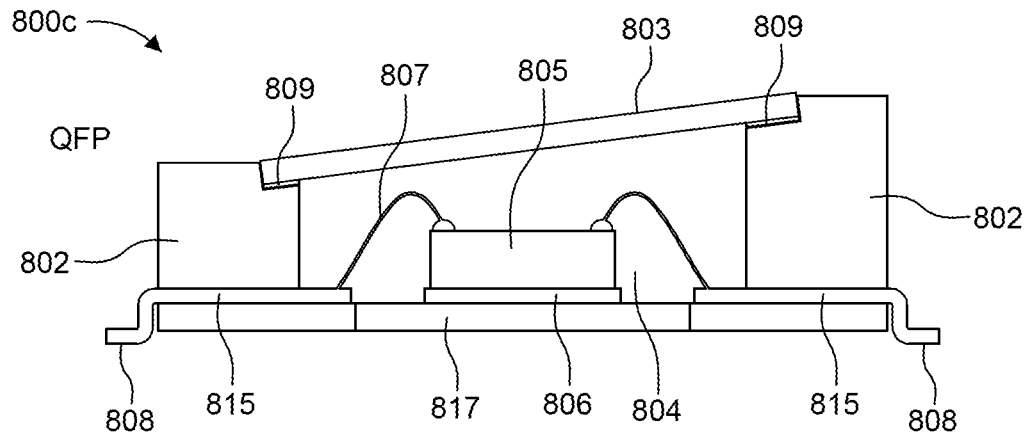

FIGS. 8A-8C show cross-sectional views illustrating another embodiment of package assemblies 800a, 800b, and 800c according to one or more embodiments, respectively. Each package assembly 800a, 800b, and 800c has similar features to those features shown in the previous examples, and particularly show DSOF, QFN, and QFP package types, respectively, but are not limited to these package types.

In particular, package assemblies 800a, 800b, and 800c include an asymmetric pre-molded structure 802 configured to support a glass substate 803 at a fixed tilt angle, and are non-hermetic. Each package assembly 800a, 800b, and 800c includes a pre-mold cavity 804 (e.g., filled with air having atmospheric pressure) formed by the nature of the asymmetry of the pre-molded structure 802, a MEMS device 805, a die attach layer 806, bonding wires 807, and an electrical interface 808.

The asymmetric pre-mold body 802 is a single integral member that surrounds the MEMS device 805. The pre-mold body 802 is configured or shaped, and may include angled grooves or notches, to receive and hold the glass substrate 803 at a fixed tilt angle. In particular, the pre-mold body 802 has a lower end (left side) that is less elevated and a higher end (right side) that is more elevated such that the glass substrate 803 is tilted and held at the tilt angle. Glue 809 (e.g., epoxy glue) disposed in the grooves or at the inside edges of the pre-mold body 802 may also be used to bond the glass substrate 803 to the pre-mold body 802.

In FIG. 8A, the MEMS device 805 is supported by and bonded to the pre-mold body 802. In FIGS. 8B and 8C, the MEMS device 805 is supported by and bonded to a die paddle 817, which is used in carrier lead frames and is typically including silver plating. The pre-mold body 802 surrounds the entire perimeter of the die paddle 817. Metal interconnects 815 may be used to connect a bond pad 816 to an electrical interface 808.

Figure 9:
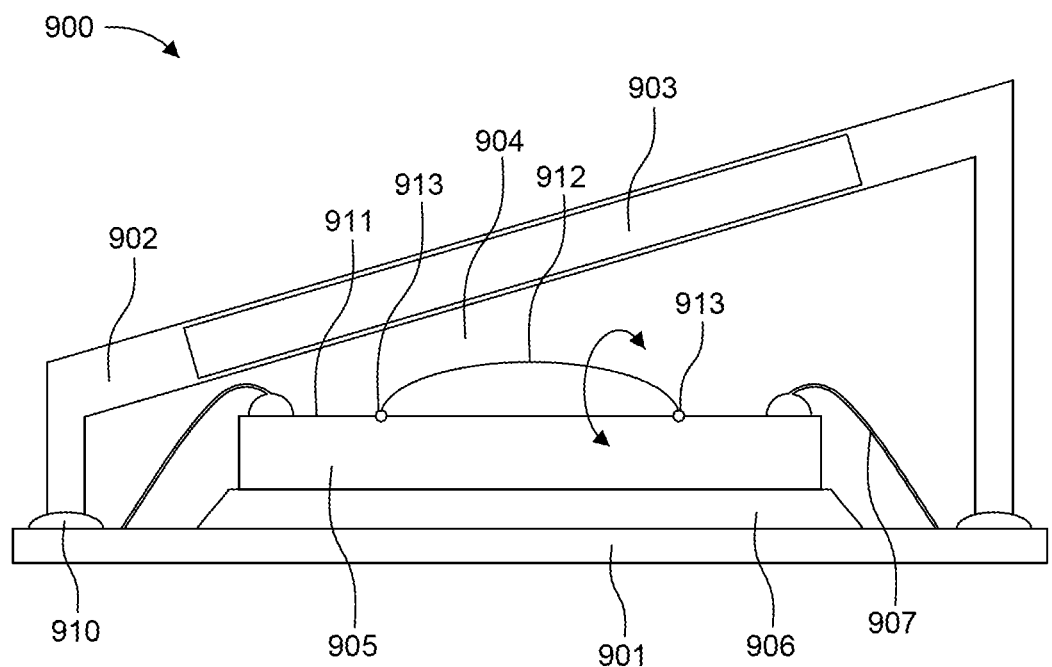
FIG. 9 shows a cross-sectional view illustrating another embodiment of a package assembly according to one or more embodiments.
Figure 10A:
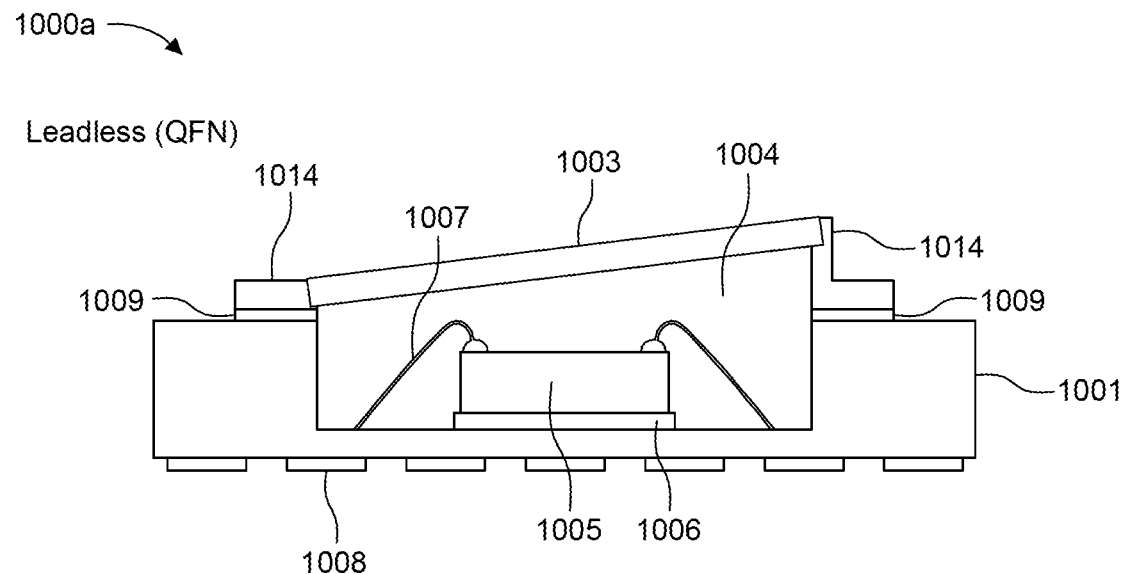
FIGS. 10A-10D show cross-sectional views illustrating another embodiment of package assemblies according to one or more embodiments.
Figure 10B:
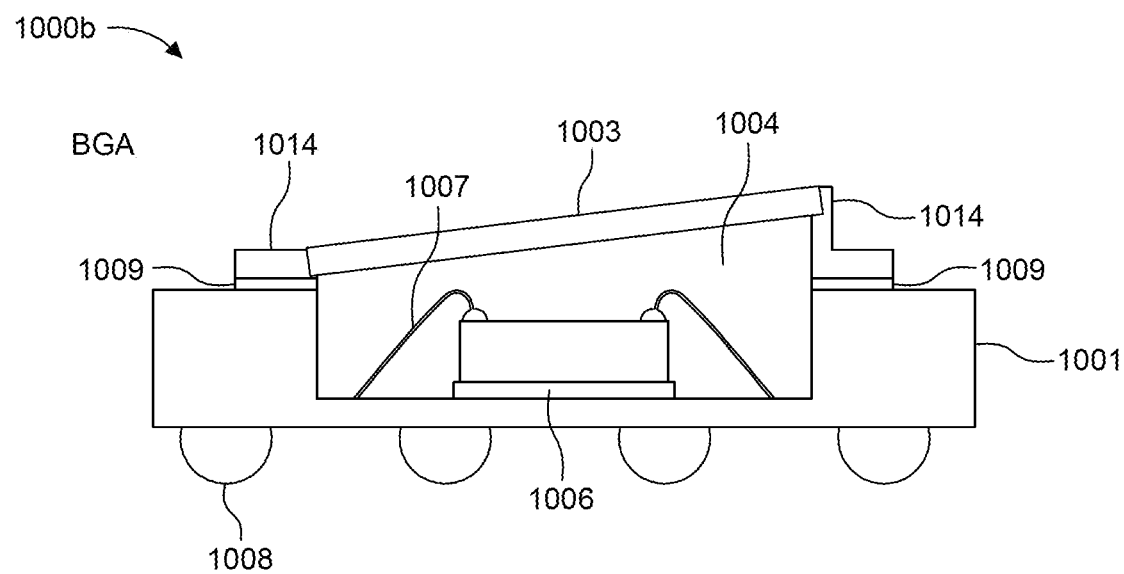
Figure 10C:
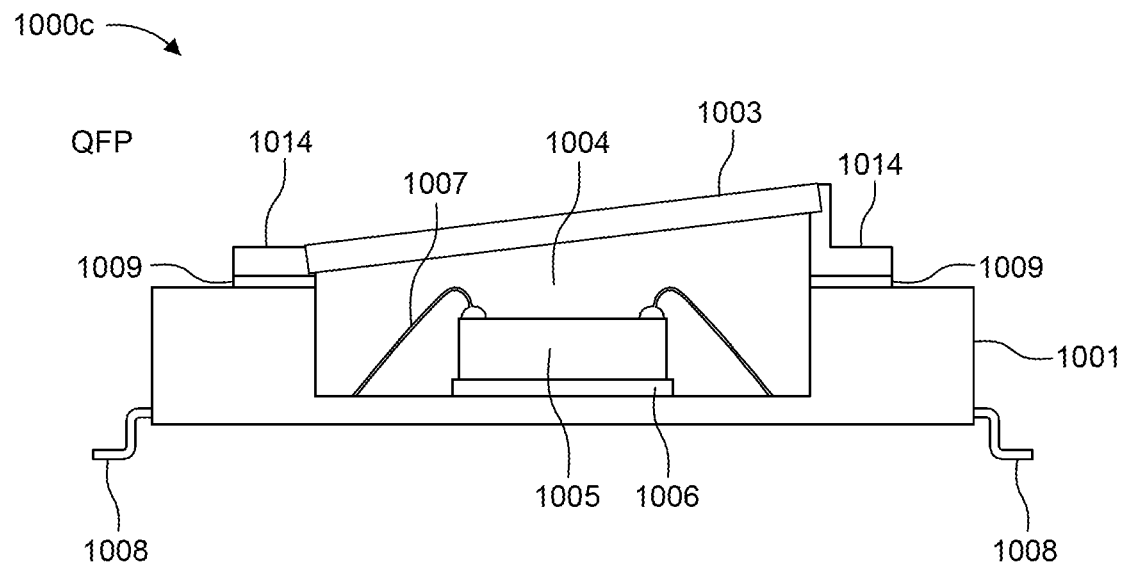
Figure 10D:
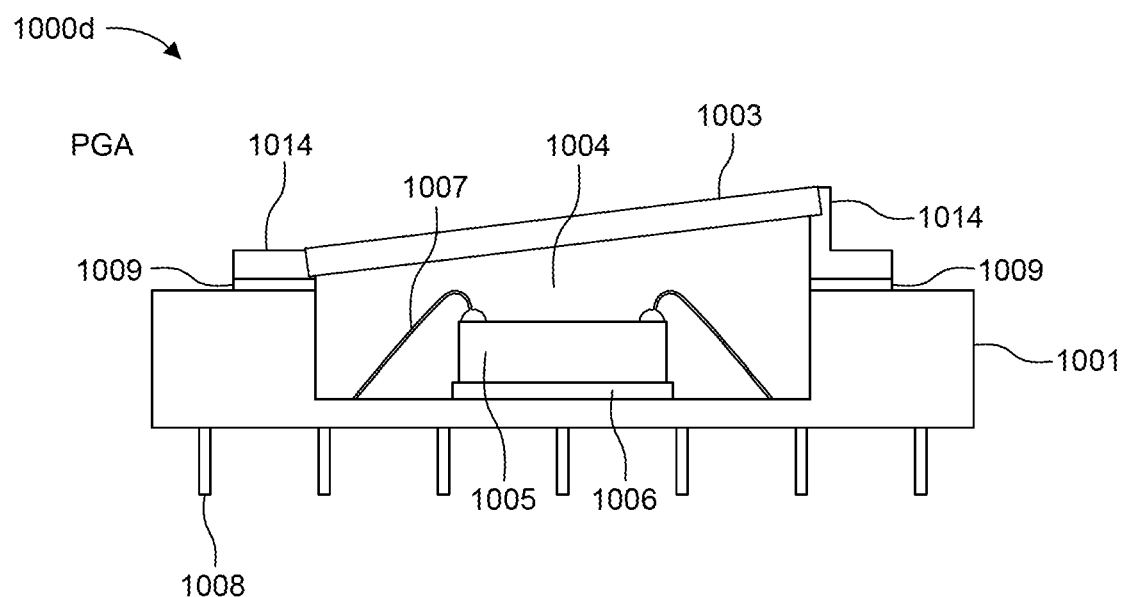

FIG. 9 shows a cross-sectional view illustrating another embodiment of a package assembly 900 according to one or more embodiments. The package assembly 900 has similar features to those features shown in previous examples, and is package-type generic for simplicity. However, any package type may be used.

In particular, package assembly 900 includes a ceramic substrate 901 with a metal cavity cap 902, and is hermetic. The metal cavity cap 902 includes an integrated optical window 903, such as a glass substrate, for transmitting light therethrough. The metal cavity cap 902 and the optical window 903 form a sealed integrated member that forms a cavity 904 when disposed onto a substrate 901 such that the cavity 904 surrounds the MEMS device 905 or some other optical chip that is disposed on the substrate 901. The cavity 904 may be filled with air with atmospheric pressure or nitrogen gas $N_2$.

The metal cavity cap 902 has an asymmetric (e.g., wedge) shape and thereby forms the cavity 904 that has an asymmetric shape. The metal cavity cap 902 is bonded to the substrate 901 by solder (e.g., AuSn or other metal alloy having a high melting point). The metal cavity cap 902 has an upper portion that is tilted at a tilt angle with respect to the substrate 901 and the MEMS device 905.

Similar to the previous examples, the package assembly 900 also includes a die attach layer 906, bonding wires 907, and a MEMS mirror 912 attached at the upper surface 911 at pivot points 913. The pivot points 913 are aligned on a scanning axis such that the MEMS mirror 912 is configured to move about the scanning axis that extends parallel to the upper surface 911. For example, the MEMS mirror 912 may be controlled to oscillate back and forth (into and out of the page, orthogonal to the tilt plane of the metal cavity cap 902) about the scanning axis to perform a horizontal scanning operation.

FIGS. 10A-10D show cross-sectional views illustrating another embodiment of package assemblies 1000a, 1000b, 1000c, and 1000d according to one or more embodiments. The package assemblies 1000a, 1000b, 1000c, and 1000d have similar features to those features shown in the previous examples, and particularly show leadless QFN, BGA, QFP, and PGA package types, respectively, but are not limited to these package types.

In particular, package assemblies 1000a, 1000b, 1000c, and 1000d are cavity packages in which the cavity 1004 is primarily formed as a result of a shape of a ceramic carrier structure 1001, which forms a recess in which the MEMS device 1005 is disposed. The ceramic carrier structure 1001 is a single structure whose walls surround the recess to form the cavity 1004.

In addition, a frame structure 1014, made of Kovar® or NiFe, may be used in a similar manner described above in other examples in order to form a support structure for the glass substrate 1003 that is disposed at a fixed tilt angle. The frame structure 1014 may be bonded to the ceramic carrier structure 1001 by using a bonding agent 1009, such as glue (e.g., silicon glue) in a nearly-hermetic configuration or by using glass solder for a hermetic configuration.

The package assemblies 1000a, 1000b, 1000c, and 1000d also include a die attach layer 1006, bonding wires 1007, and an electrical interface 1008.

Figure 11:
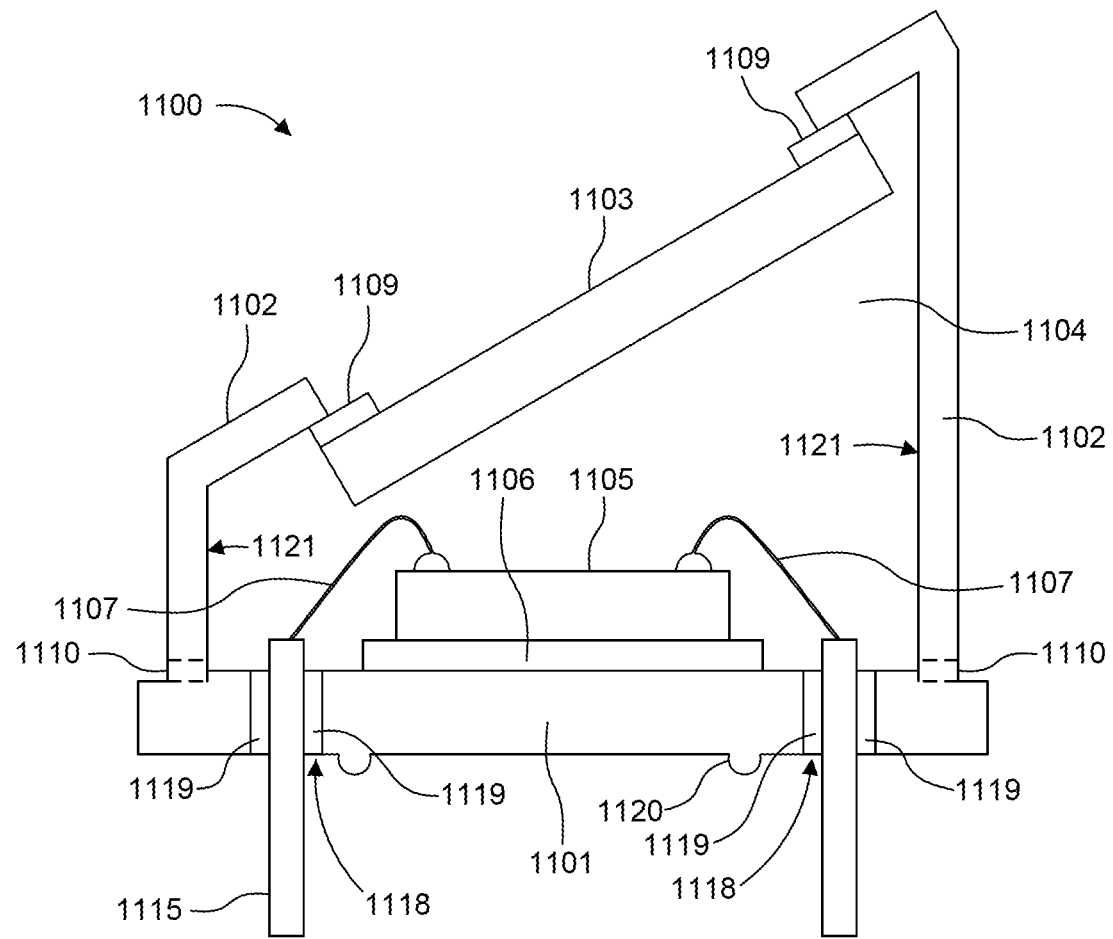
FIG. 11 shows a cross-sectional view illustrating another embodiment of a package assembly according to one or more embodiments.

FIG. 11 shows a cross-sectional view illustrating another embodiment of a package assembly 1100 according to one or more embodiments. The package assembly 1100 has similar features to those features shown in previous examples, and is a TO package.

In particular, the package assembly 1100 includes a metal header base 1101 (i.e., substrate) with a metal cavity cap 1102, and is hermetic. The metal cavity cap 1102 may be integrally formed (formed into a single piece) as a signal member with the metal header base 1101 or may be bonded to the metal header base 1101 with a metallic solder 1110, shown in a dotted outline as an optional feature. For example, if the metal cavity cap 1102 is made of Kovar®, AuSn solder may be used for solder 1110. If the metal cavity cap 1102 is made of NiFe, gold-tin (AuSn) solder may be used or another type of high-melting alloy (e.g., with the same or higher melting point as AuSn) may be used. In addition, if the metal cavity cap 1102 is made of Kovar®, the inside walls may be plated or lined with gold (Au).

The package assembly 1100 also includes an optical window 1103, such as a glass substrate, for transmitting light therethrough. The optical window 1103 may be bonded to the metal cavity cap 1102 with glass solder 1109.

The metal header base 1101, the metal cavity cap 1102, and the optical window 1103 form a hermetically sealed cavity 1104 in which the MEMS device 1105 resides. The cavity 1104 may be filled with air having atmospheric pressure or nitrogen gas $N_2$.

The metal cavity cap 1102 has an asymmetric (e.g., wedge) shape and thereby forms the cavity 1104 that has an asymmetric shape. The metal cavity cap 1102 has an upper portion that is tilted at a tilt angle with respect to the metal header base 1101 and the MEMS device 1105.

Similar to the previous examples, the package assembly 1100 also includes a die attach layer 1106 (e.g., silicon glue) and bonding wires 1107. The bonding wires 1107 are electrically coupled to a metal interconnect 1115 that is inserted into a through-hole 1118 formed in the metal header base 1101. Each through-hole 1118 is filled with a sealing agent 1119 (e.g., glass solder) that secures each respective interconnect 1115 in place, provides isolation (i.e., isolates the metal interconnect 1115 from the metal header base 1101), and also hermetically seals the cavity 1104. Furthermore, it will be appreciated that instead of a metal header base 1101, a ceramic base may be used as the substrate.

The package assembly 1100 may also include one or more nubs 1120 on the under-side of the metal header base 1101. The nubs 1120 may be used to support plane seating of the TO package onto a PCB.

Figure 12A:
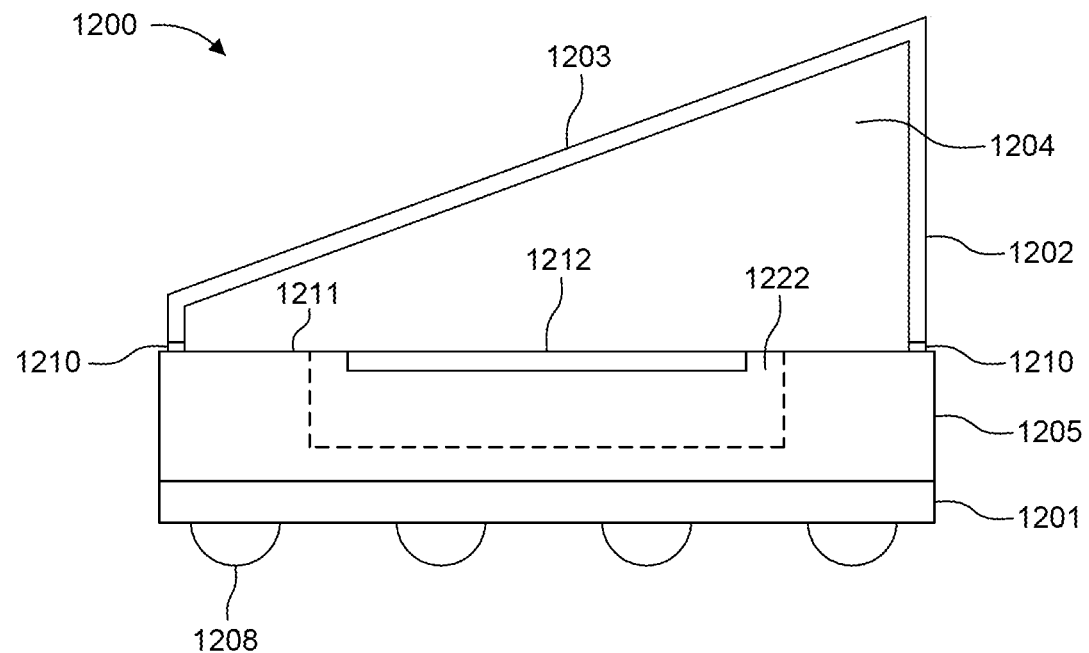
FIGS. 12A-12C show cross-sectional views illustrating another embodiment of a package assembly according to one or more embodiments.
Figure 12B:
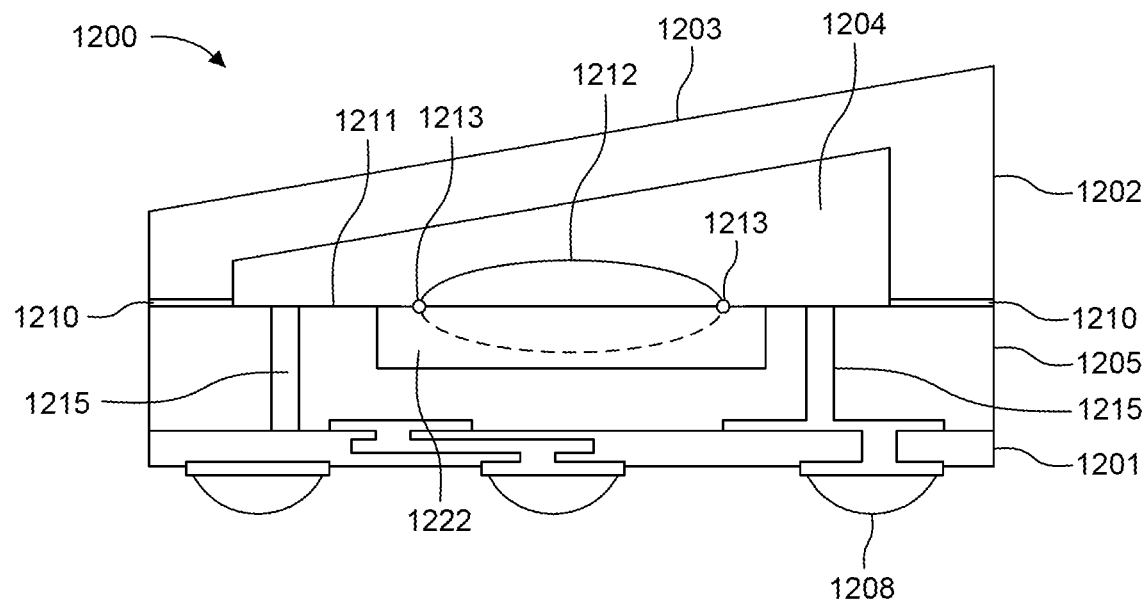
Figure 12C:
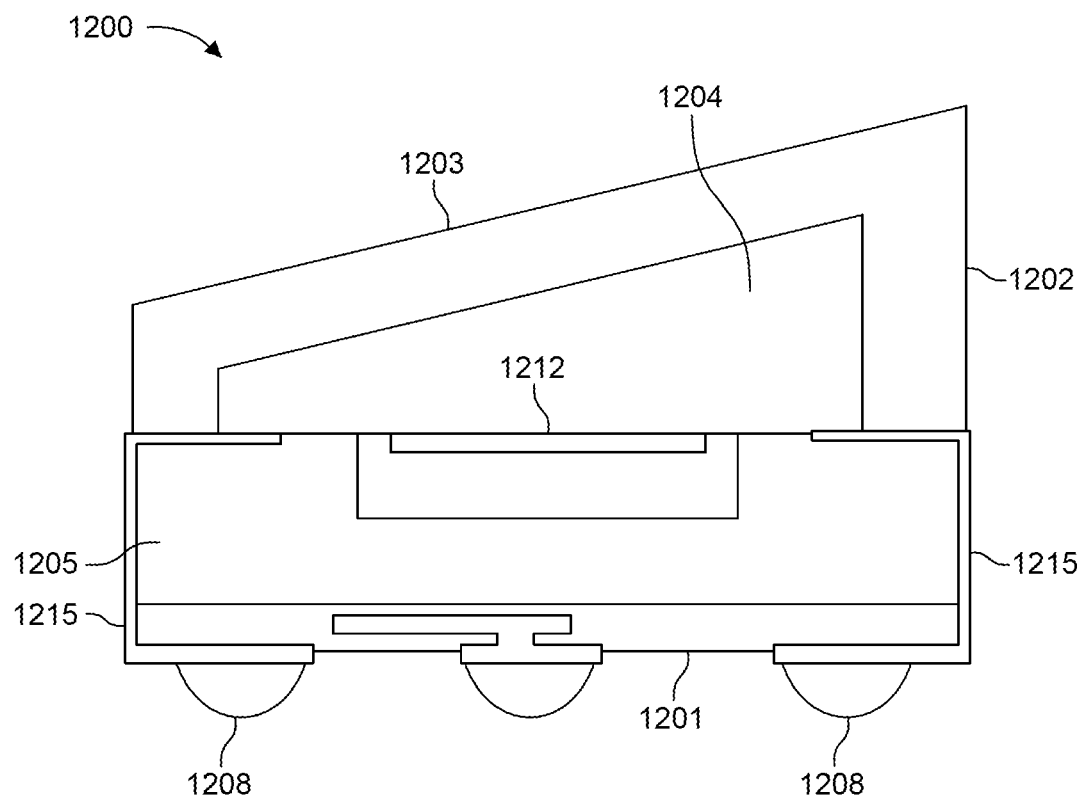

FIGS. 12A-12C show cross-sectional views illustrating another embodiment of a package assembly 1200 according to one or more embodiments. The package assembly 1200 has similar features to those features shown in previous examples, and is shown as a BGA package type. However, other package types may be used.

In particular, package assembly 1200 may be non-hermetic or hermetic depending on the materials used, and includes a glass cavity cap 1202 (i.e., a glass lid or encasement) implemented at a chip-level or a wafer-level. That is, the glass cavity cap 1202 is disposed directly onto the MEMS device 1205 (i.e., the semiconductor chip) or a semiconductor wafer that will be singulated into separate MEMS devices 1205 (i.e., separate semiconductor chips).

The glass cavity cap 1202 is transparent lid formed as a single member and may be part of a glass wafer. The glass cavity cap 1202 forms a cavity 1204 when disposed onto the MEMS device 1205 or on a semiconductor wafer that includes the MEMS device 1205 such that the cavity 1204 encases the MEMS mirror 1212 and at least part of the upper surface 1211. The glass cavity cap 1202 has an asymmetric (e.g., wedge) shape and thereby forms the cavity 1204 that has a corresponding asymmetric shape. Thus, the glass cavity cap 1202 has an upper surface 1203 that is tilted at a tilt angle with respect to the upper surface 1211 of the MEMS device 1205.

The glass cavity cap 1202 is bonded to the MEMS device 1205 and/or the semiconductor wafer by a bonding agent 1210. The bonding agent 1210 may be glue (e.g., silicon glue) for a non-hermetic configuration or glass solder (i.e., glass frit) for a hermetic configuration. Alternatively, instead of using the bonding agent 310 anodic bonding may be used to bond the glass cavity cap 1202 to the MEMS device 1205 and/or the semiconductor wafer. Anodic bonding is a wafer bonding process to seal glass to either silicon or metal without introducing an intermediate layer, and, when used here, to seal glass to silicon wafers or chips.

The MEMS device 1205 is disposed on a substrate layer 1201, which may be an interposer layer or an RDL layer, which may be comprised of one or more interposer or RDL layers. An interposer is an electrical interface routing between one socket or connection to another. The purpose of an interposer is to spread a connection to a wider pitch or to reroute a connection to a different connection. An RDL is an extra metal layer on a chip that makes the IO pads of an integrated circuit available in other locations. The RDL is made of dielectric and conductive layers. Thus, the substrate layer 1201 (i.e., the interposer layer or the RDL layer) is configured to provide one or more electrical connections to the MEMS device 1205 to the electrical interface 1208.

For example, the MEMS device 1205 is configured to receive control signals from an external device via the electrical interface 1208 and conductive interconnects 1215 (i.e., TSVs), as shown in FIG. 12B, to control a driver of the MEMS mirror 1212 according to a protocol. The driver of the MEMS mirror 1212 then drives the oscillation of the MEMS mirror 1212 about the pivot points 1213. Thus, the MEMS mirror 1212 may be controlled to oscillate back and forth (into and out of the page, orthogonal to the tilt plane of the glass cavity cap 1202) about the scanning axis to perform a horizontal scanning operation. A mirror cavity 1222 inside the MEMS device 1205 allows enough clearance for the MEMS mirror 1212 to oscillate based on its range of oscillation.

In addition or in the alternative to using TSVs or similar via, conductive interconnects 1215 (i.e., conductive lines or paths) may be formed that extend from a top (front-side) to a bottom (back-side) of the MEMS device 1205 along a side wall of the MEMS device 1205 using a sidewall metal, as shown in FIG. 12C. That is, the conductive interconnects 1215 may be disposed along a perimeter of the MEMS device 1205 (i.e., MEMS chip) from a bondpad inside the cavity 1204 to an electrical interface 1208.

FIGS. 13A-13D show cross-sectional views illustrating a process of manufacturing the package assembly 1200 shown in FIGS. 12A and 12B according to one or more embodiments.

Figure 13A:
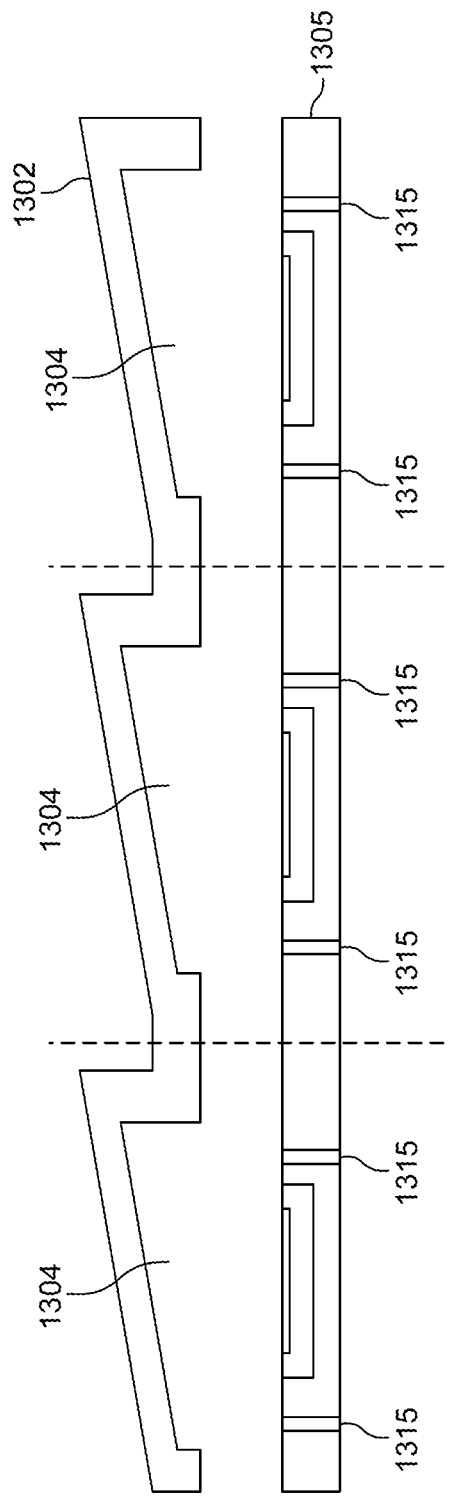
FIGS. 13A-13D show cross-sectional views illustrating a process of manufacturing the package assembly shown in FIGS. 12A and 12B according to one or more embodiments.

FIG. 13A demonstrates a wafer-bonding process of bonding a glass cavity-wafer 1302 to a MEMS wafer 1305 using, for example, anodic bonding. The glass cavity-wafer 1302 includes a plurality of cavity portions 1304 that do not make contact with the MEMS wafer 1305. Each of the plurality of cavity portions 1304 correspond to a different cavity 1204 formed for a different MEMS device 1205.

In addition, the MEMS wafer 1305 includes a plurality of MEMS devices 1205 that will be later singulated in a dicing process.

The MEMS wafer 1305 may further include TSVs 1315 (i.e., conductive interconnects) that will later provide each MEMS device 1205 with an electrical connection to an electrical interface 1208. Conductive lines may also be formed from top to bottom along a side wall of the MEMS chips (i.e., MEMS device 1205) after singulation, as shown in FIG. 12C.

Figure 13B:
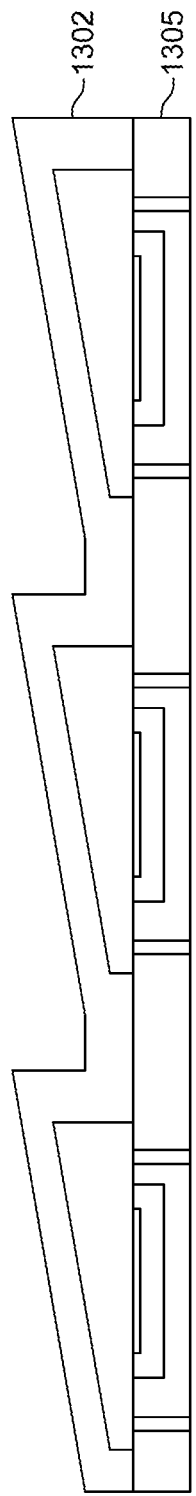

FIG. 13B shows the glass cavity-wafer 1302 to a MEMS wafer 1305 after the wafer-bonding process. Wafer-bonding does not need openings or a complex singulation process to expose wirebond pads. At the same time, the glass wafer 1305 can cover and protect the whole chip surface for every chip without exposing bondpads.

Figure 13C:
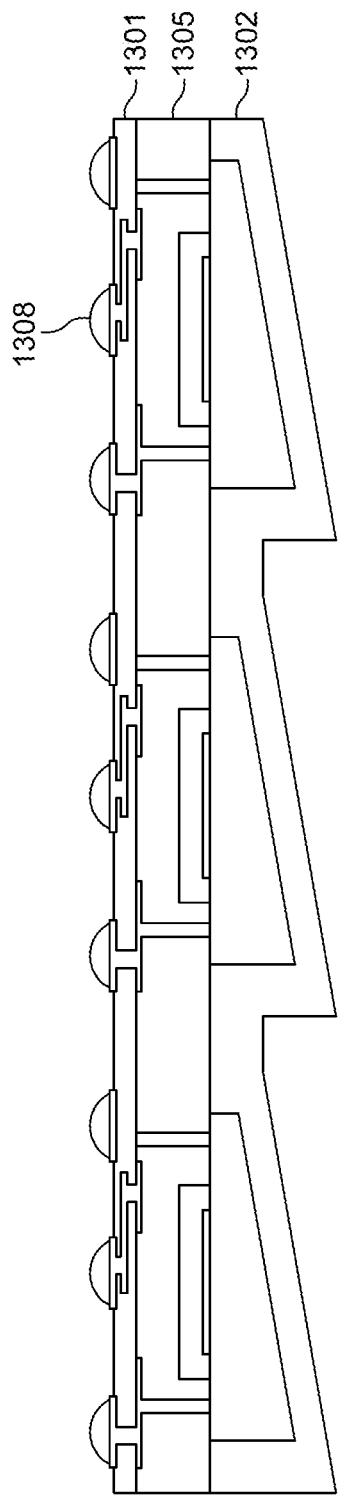

FIG. 13C demonstrates a deposition process of disposing an RDL 1301 on backside of the MEMS wafer 1305, with a further optional deposition of solder depots (solder balls) 1308, a process which may be adapted for a particular type of chip carrier package or system.

Figure 13D:
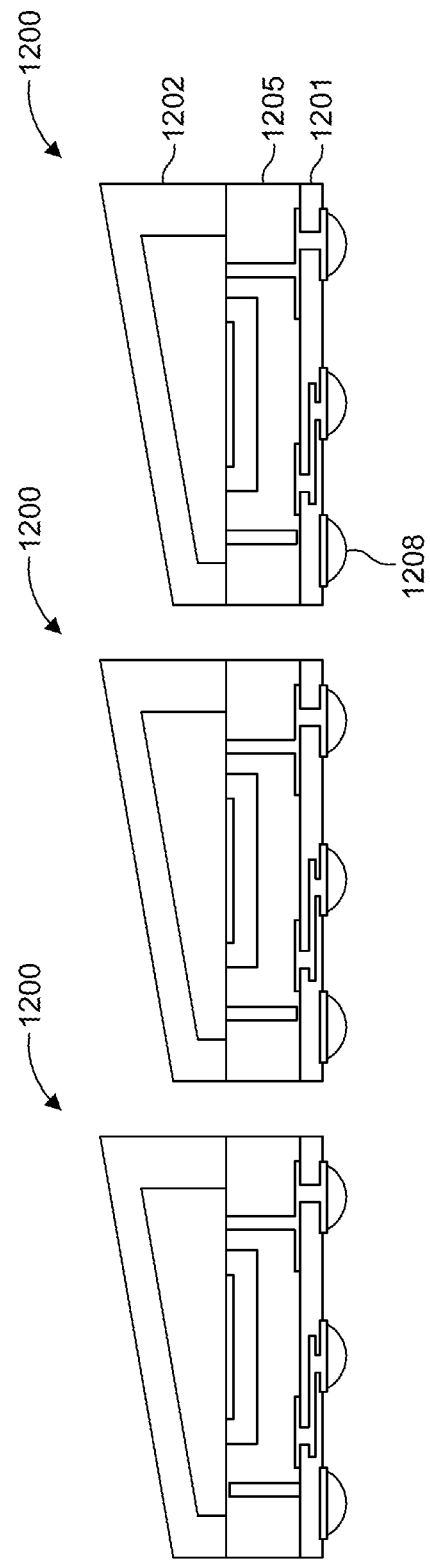

FIG. 13D demonstrates a dicing process during which the bonded wafers 1302 and 1305 in FIG. 13C are singulated into individual chips (i.e., MEMS devices 1205). Conductive lines 1215, as shown in FIG. 12C, may be also formed at this time.

Figure 14:
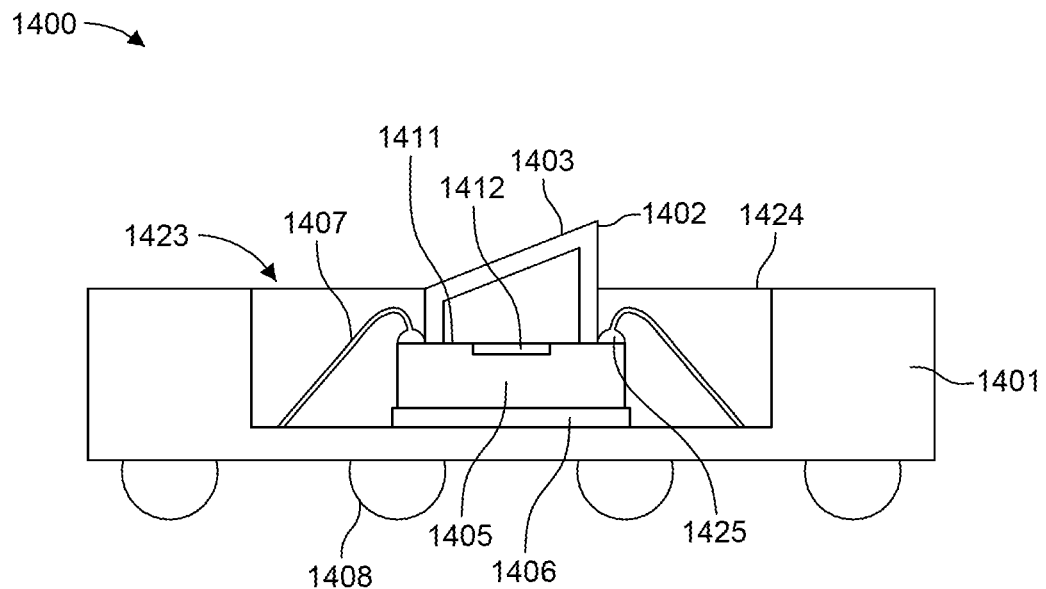
FIG. 14 shows cross-sectional view illustrating another embodiment of a package assembly according to one or more embodiments.

FIG. 14 shows cross-sectional view illustrating another embodiment of a package assembly 1400 according to one or more embodiments. The package assembly 1400 has similar features to those features shown in the previous examples, and particularly shows a BGA package type, but is not limited to this package type. For example, another package type that has a leadless footprint may also be used.

In particular, package assembly 1400 is a cavity package in which a substrate cavity 1423 is formed as a result of a shape of the substate 1401, which may be an organic, PCB-like material or ceramic. The substrate 1401 forms a recess (i.e., substrate cavity 1423) in which the MEMS device 1405 is disposed, bonded thereto using a die attach layer 1406. The substrate 1401 may be formed of a single, premolded structure or may be formed by "stamping" multiple layers of material (e.g., PCB material) together to form the walls that surround the recess, or may be ceramic that is formed or premolded in the desired shape.

In addition, the package assembly 1400 includes a glass cavity cap 1402 that is disposed onto the MEMS device 1405 such that a MEMS mirror 1412 is encapsulated and protected. The glass cavity cap 1402 has an asymmetric shape such that its upper surface 1403 is inclined at a tilt angle. In particular, the glass cavity cap 1402 has a first wall that shorter than a second wall (right side) such that the upper surface 1403, extending from the first wall to the second wall, is tilted and held at the tilt angle.

The glass cavity cap 1402 is also provided on the MEMS device 1405 inside and away from an edge portion (i.e., a perimeter) of the upper surface 1411 of the MEMS device 1405 such that bondpads 1425 located at the edge portion are external to the glass cavity cap 1402. Thus, the bondpads 1425 are located outside of cavity 1404 so that they can be connected to a respective bonding wire 1407.

The package assembly 1400 further includes an encapsulant 1424 that is disposed into the substrate cavity 1423, onto the substrate 1401, and surrounds the MEMS device 1405, the bond pads 1425, the bonding wires 1407, and a portion of the glass cavity cap 1402. The encapsulant 1424 provides protection to the MEMS device 1405 and seals the MEMS device 1405 from the environment. In addition, the encapsulant 1424 is disposed such that the top surface 1403 of the glass cavity cap 1402 is free or substantially free of the encapsulant 1424. That is, the encapsulant 1424 does not cover a portion of the top surface 1403 where light is expected to be transmitted therethrough, so as to not block or impede the transmission of light.

The encapsulant 1424 may be made of a material that has a low Young's modulus so that the MEMS device 1405 is surrounded by a low stress material to reduce mechanical stress exerted on the MEMS device 1405. For example, the encapsulant may be 1424 a mold compound, a liquid epoxy, a gel, a soft epoxy, or a soft encapsulant, and may be silicone-based. A mold compound, as used herein, may have a Young's modulus of between 15-30 gigapascals (GPa). The encapsulant 1424 may also be in this range, but would not be considered a "low stress material." A "low stress material", as used herein, exhibits a Young's moduli less than 5.0 GPa. These materials may be either special epoxy based materials (e.g., in a same material class as mold compound) or silicone based materials. Silicone based materials show a Young's modulus of approx. 0.005 GPa.

Figure 15:
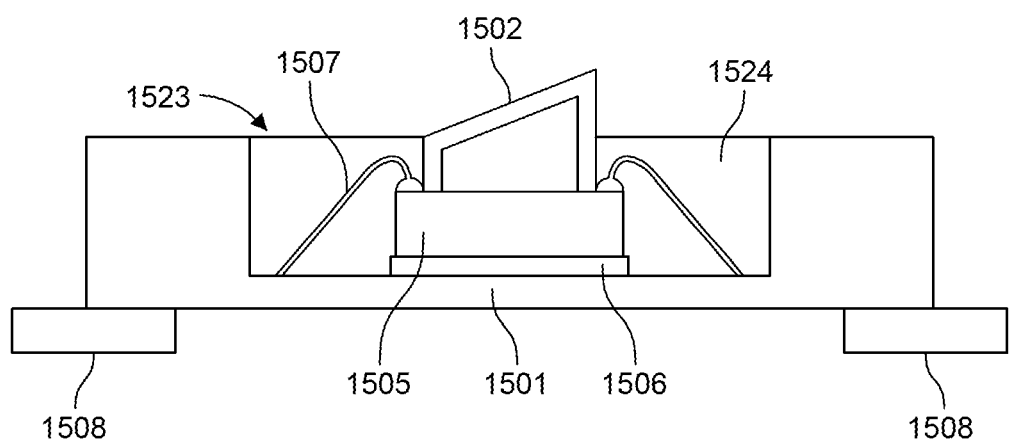
FIG. 15 shows cross-sectional view illustrating another embodiment of a package assembly according to one or more embodiments.

FIG. 15 shows cross-sectional view illustrating another embodiment of a package assembly 1500 according to one or more embodiments. The package assembly 1500 has similar features to those features shown in the previous examples, and particularly shows a DSOF package type, but is not limited to this package type. For example, QFN and QFP package types may also be used.

In FIG. 15, the MEMS device 1505 is supported by and bonded to the pre-mold body 1501, which may be a pre-molded leadframe with leads as electrical interfaces 1508. Silicon glue may be used as a die attach layer 1506.

Other aspects of package assembly 1500 are similar to the features of the package assembly 1400, including but not limited to, substrate cavity 1523, encapsulant 1524, glass cavity cap 1502, and bonding wires 1507.

Figure 16:
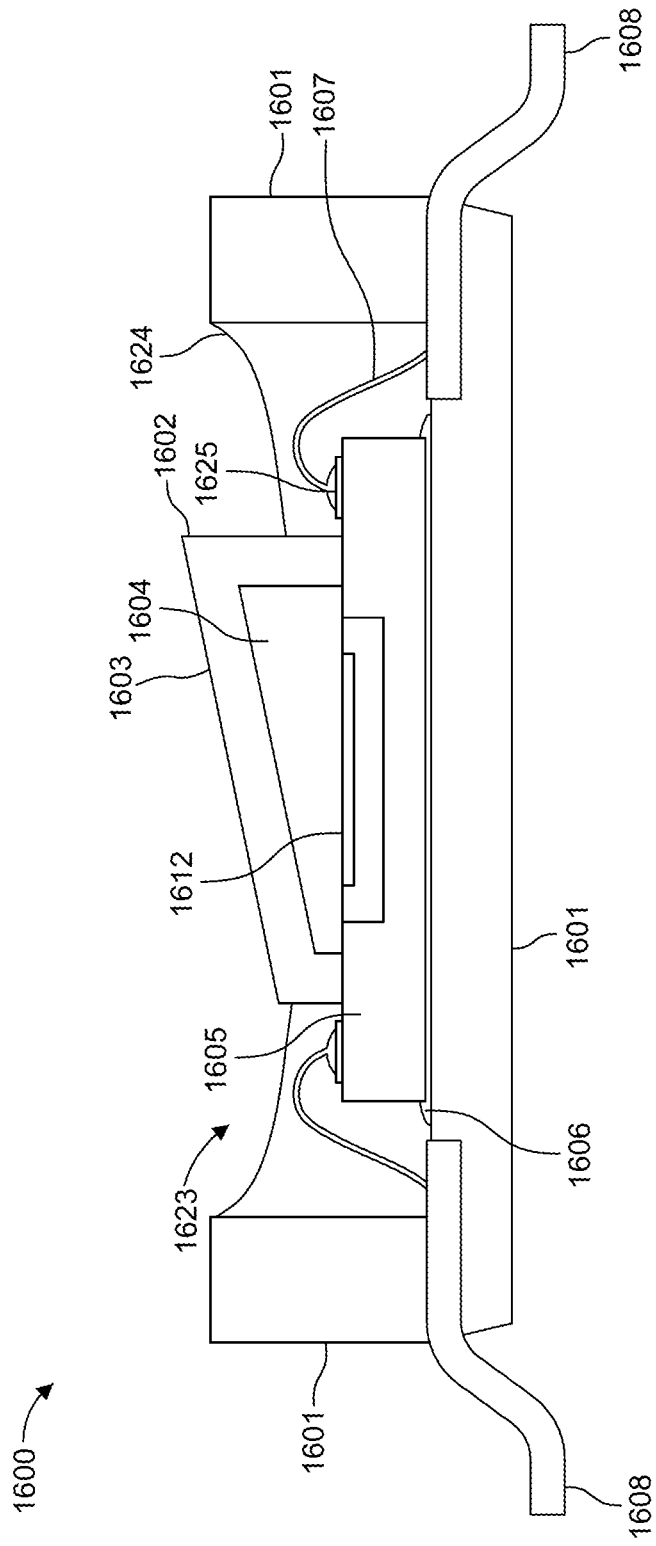
FIG. 16 shows cross-sectional view illustrating another embodiment of a package assembly according to one or more embodiments.

FIG. 16 shows cross-sectional view illustrating another embodiment of a package assembly 1600 according to one or more embodiments. The package assembly 1600 has similar features to those features shown in the previous examples, and particularly shows a QFP package type, but is not limited to this package type.

For example, the package assembly 1600 includes a chip carrier 1601 (i.e., a pre-mold body) that forms a substrate cavity 1623 (i.e., chip cavity), a glass cavity cap 1602 with a tilted top surface 1603, a cavity 1604, a MEMS device 1605, a die attach layer 1606, bonding wires 1607 electrically connected to bond pads 1625 and electrical interfaces 1608, a MEMS mirror 1612, and an encapsulant 1624 provides a low-stress attachment to the MEMS device 1605 and the chip carrier 1601. The electrical interfaces 1608 are conductive leads that extend through a sidewall of the chip carrier 1601 and are electrically coupled to respective bonding wires 1607.

Figure 17A:
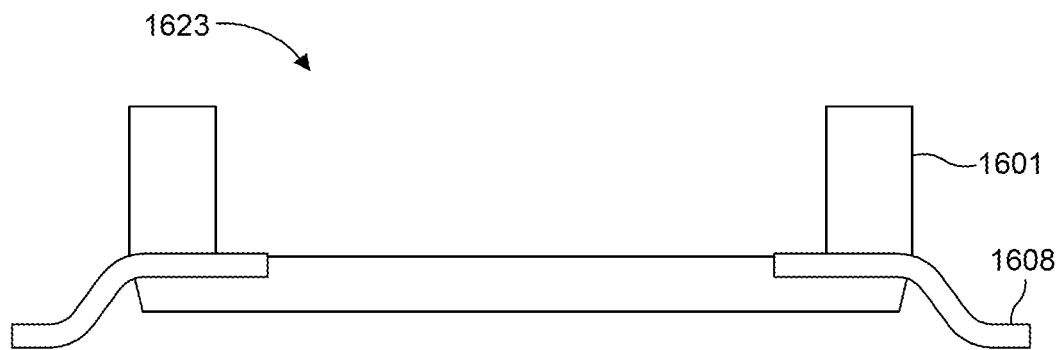
FIGS. 17A-17C show cross-sectional views illustrating a process of manufacturing the package assembly shown in FIG. 16 according to one or more embodiments.
Figure 17B:
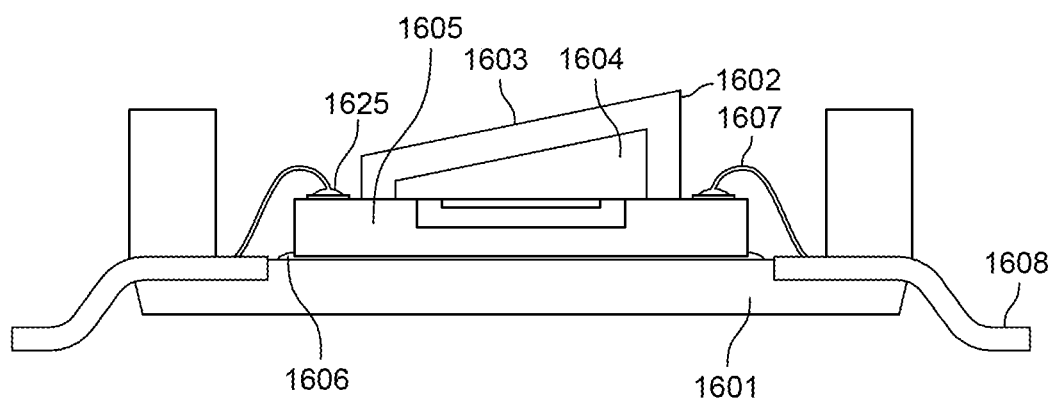
Figure 17C:
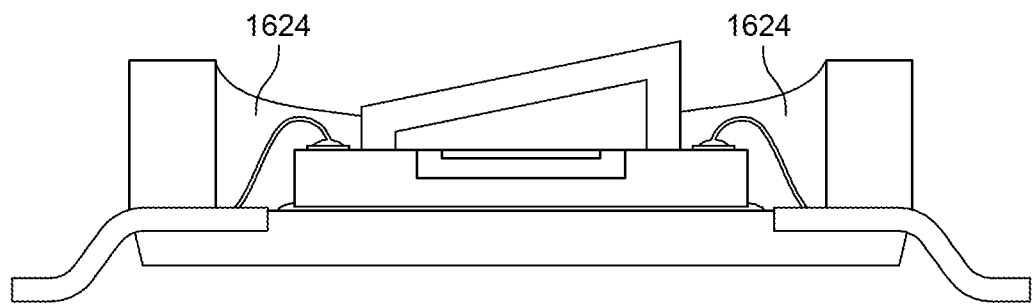

FIGS. 17A-17C show cross-sectional views illustrating a process of manufacturing forming the package assembly 1600 shown in FIG. 16 according to one or more embodiments.

FIG. 17A demonstrates forming chip carrier 1601 to have a substrate cavity 1623 and electrical interfaces 1608 extending through the sidewalls of the chip carrier 1601. The chip carrier 1601 may be a pre-mold material, a (metal) leadframe, ceramics, organic (e.g., PCB or PCB-like), and may be a single layer or multiple layers (e.g., multilayer ceramics or multilayer organic substrate).

FIG. 17B demonstrates attaching a die (i.e., the MEMS device 1605) to the chip carrier 1601 using a die attach layer 1606 (e.g., soft glue to ensure low stress MEMS attachment), and forming interconnects, including bonding wires 1607, from the die to the electrical interfaces 1608.

FIG. 17C demonstrates casting with a soft material (e.g., silicone) inside the substrate cavity 1623 to ensure a low stress environment while leaving the tilted surface 1603 of the glass cavity cap 1602 exposed to light transmission.

Figure 18:
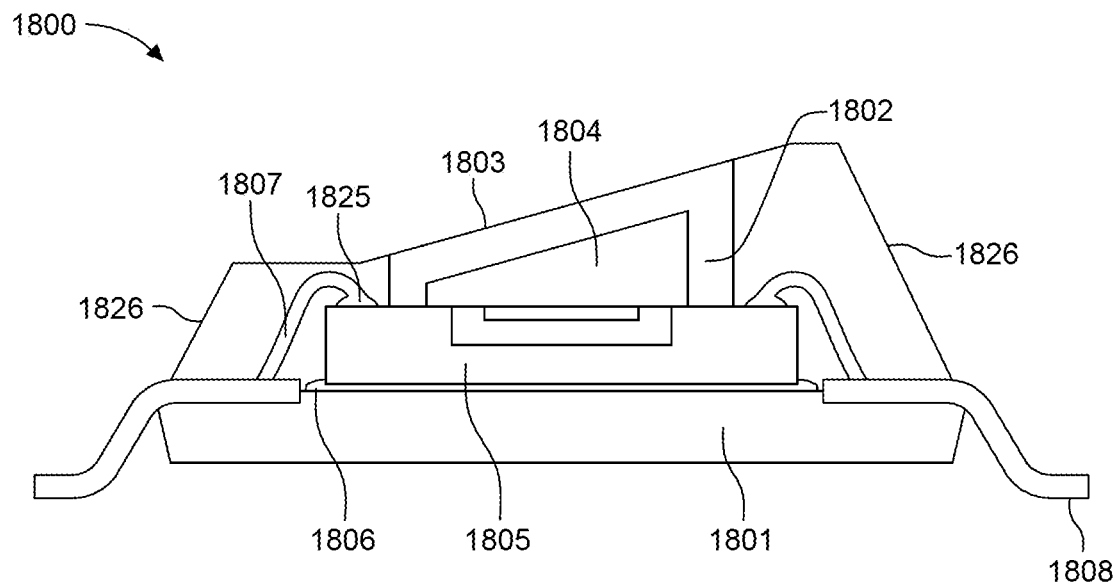
FIG. 18 shows cross-sectional view illustrating another embodiment of a package assembly according to one or more embodiments.

FIG. 18 shows cross-sectional view illustrating another embodiment of a package assembly 1800 according to one or more embodiments. The package assembly 1800 has similar features to those features shown in the previous examples, particularly to package assembly 1600, except a molded frame 1826 is used as a package structure. Here, the molded frame 1826 is disposed around the MEMS device 1805 and the glass cavity cap 1802 to encapsulate those structures, in addition to the bonding wires 1807, the bond pads 1825, and a portion of the electrical interfaces 1808 (i.e., leads).

The molded frame 1826 provides protection to the MEMS device 1805 and the other covered features, seals the MEMS device 1805 and the other covered features from the environment, and prevents the MEMS device 1805 and the other covered features from shifting within the package 1800. In addition, molded frame 1826 is disposed such that a tilted top surface 1803 of the glass cavity cap 1802 is free or substantially free of the molded frame 1826. That is, the molded frame 1826 does not cover a portion of the top surface 1803 where light is expected to be transmitted therethrough, so as to not block or impede the transmission of light. Thus, molded frame 1826 may be deposited such that the upper surface 1803 (i.e., the transmission surface) remains exposed to the environment for the transmission of light into and out of the cavity 1804. The molded frame 1826 may also undergo a hardening process to increase the rigidity of the molded frame 1826 after deposition. Even after being hardened to some degree, the molded frame 1826 may still providing a low-stress attachment to the MEMS device 1805 and the chip carrier 1801

The package assembly 1800 also includes a chip carrier 1801 (i.e., a pre-mold substrate) that supports the MEMS device 1805, a cavity 1804, a die attach layer 1806, and a MEMS mirror 1812. The electrical interfaces 1808 are conductive leads that extend on a surface of the chip carrier 1801 to eventually extend outside of the package assembly 1800 and are electrically coupled to respective bonding wires 1807.

Figure 19:
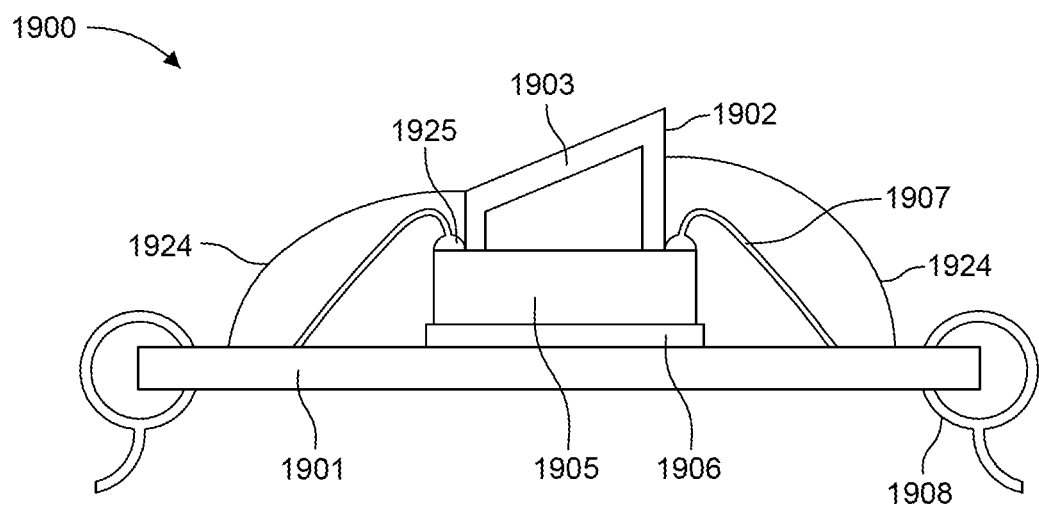
FIG. 19 shows cross-sectional view illustrating another embodiment of a package assembly according to one or more embodiments.

FIG. 19 shows cross-sectional view illustrating another embodiment of a package assembly 1900 according to one or more embodiments. The package assembly 1900 has similar features to those features shown in the previous examples, particularly to package assembly 1600, except a pre-mold body that forms a chip cavity is not present. Instead, a globtop soft encapsulant 1924 is deposited around the MEMS device 1905 and the glass cavity cap 1902 to encapsulate those structures, in addition to the bonding wires 1907, the bond pads 1925, and a portion of the chip carrier 1901. The chip carrier 1901 may be a laminate substrate on which the MEMS device 1905 is disposed via a die attach layer 1906, but is not limited thereto and may be made of any suitable material.

The globtop soft encapsulant 1924 may be made of a material that has a low Young's modulus so that the MEMS device 1905 is surrounded by a low stress material to reduce mechanical stress exerted on the MEMS device 1905. For example, the encapsulant may be 1924 a mold compound, a liquid epoxy, a gel, or a soft epoxy, and may be silicone-based. A mold compound, as used herein, may have a Young's modulus of between 15-30 gigapascals (GPa). The globtop soft encapsulant 1924 may also be in this range, but would not be considered a "low stress material." A "low stress material", as used herein, exhibits a Young's moduli less than 5.0 GPa. These materials may be either special epoxy based materials (e.g., in a same material class as mold compound) or silicone based materials. Silicone based materials show a Young's modulus of approx. 0.005 GPa.

The package assembly 1900 also includes a chip carrier 1901 (i.e., a pre-mold substrate) that supports the MEMS device 1905, a cavity 1904, a die attach layer 1906, and a MEMS mirror 1912. The electrical interfaces 1908 are conductive leads that extend on a surface of the chip carrier 1901 to eventually extend outside of the package assembly 1900 and are electrically coupled to respective bonding wires 1907.

Figure 20A:
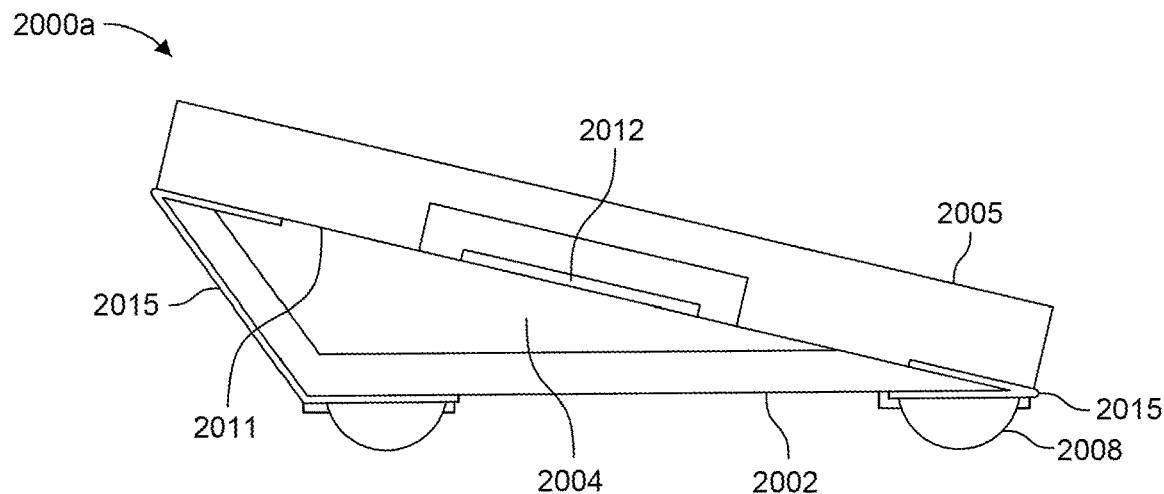
FIGS. 20A-20C show cross-sectional views illustrating another embodiment of a group of package assemblies according to one or more embodiments.
Figure 20B:
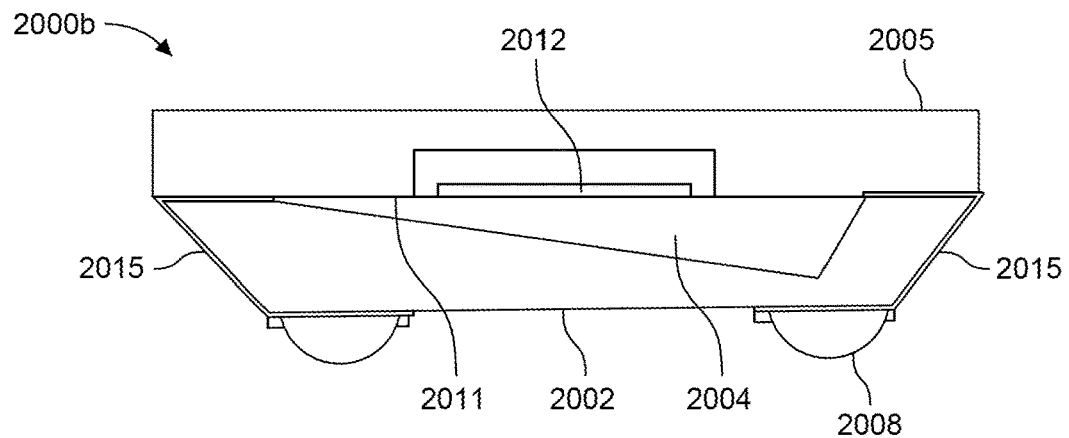
Figure 20C:
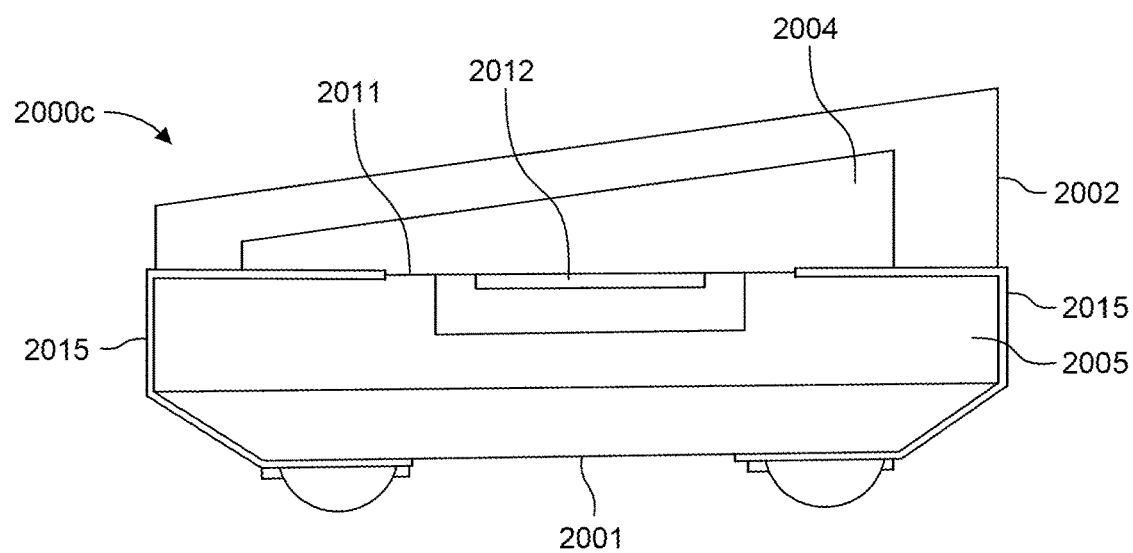

FIGS. 20A-20C show cross-sectional views illustrating another embodiment of a group of package assemblies 2000a, 2000b, and 2000c according to one or more embodiments. The package assemblies 2000a, 2000b, and 2000c have similar features to those features shown in previous examples, particularly similarly to package assembly 1200, and is shown as a BGA package type. However, other package types may be used.

Furthermore, a wafer-level process, similar to that described in reference to FIGS. 13A-13D may be used to manufacture the package assemblies 2000a, 2000b, and 2000c.

In particular, each package assembly 2000a, 2000b, and 2000c includes a glass cavity cap 2002 (i.e., a glass lid or encasement) implemented at a chip-level or a wafer-level. That is, the glass cavity cap 2002 is disposed directly onto the MEMS device 2005 (i.e., the semiconductor chip) or a semiconductor wafer that will be singulated into separate MEMS devices 2005 (i.e., separate semiconductor chips).

The glass cavity cap 2002 is transparent lid formed as a single member and may be part of a glass wafer. The glass cavity cap 2002 forms a cavity 2004 at a front-side of the MEMS device 2005 when disposed onto the MEMS device 2005 or on a semiconductor wafer that includes the MEMS device 2005 such that the cavity 2004 encases the MEMS mirror 2012 and at least part of the main surface 2011 of the MEMS device 2005.

The glass cavity cap 1202 may have an asymmetric (e.g., wedge) shape at its external perimeter and/or internal perimeter, as in package assemblies 2000a, and 2000c, or a symmetrical shape at its external perimeter and an asymmetric shape at its internal perimeter, as in package assembly 2000b. In either configuration, static reflections are reduced or eliminated by the tilt angle formed by one of more surfaces (external and/or internal surfaces) of the glass cavity cap 2002 with respect to the main surface 2011 of the MEMS device 2005, and more particularly, with respect to the scanning axis of the MEMS mirror 2012.

In addition, electrical interfaces 2008 (e.g., solder balls) may be coupled to the glass cavity cap 2002 by any bonding agent or adhesive described herein, while leaving an optical window of the glass cavity cap free from any obstruction so that light can pass bidirectionally therethrough. Conductive interconnects 2015 (i.e., conductive lines or paths) may be formed at a periphery of the glass cavity cap 2002 such that they extend from a front-side of the MEMS device 2005, along a sidewall of the glass cavity cap 2002, to one of the electrical interfaces 2008. Inside the cavity 2004, the conductive interconnects 2015 may be coupled to a respective bondpad on the MEMS main surface 2011 for driving the MEMS mirror 2012.

Additionally, in FIG. 20C, the package assembly 2000c includes a glass substrate 2001 at the back side of the MEMS device 2005 on which the MEMS device is disposed and bonded to. Any bonding method described herein may be used to bond glass to the front side and back side of semiconductor chip. In addition, both the glass substrate 2001 and the glass cavity cap 2002 may be formed from glass wafers disposed on a MEMS semiconductor wafer, before a dicing process, similar to the process described above in conjunction with FIGS. 13A-13D.

Figure 21:
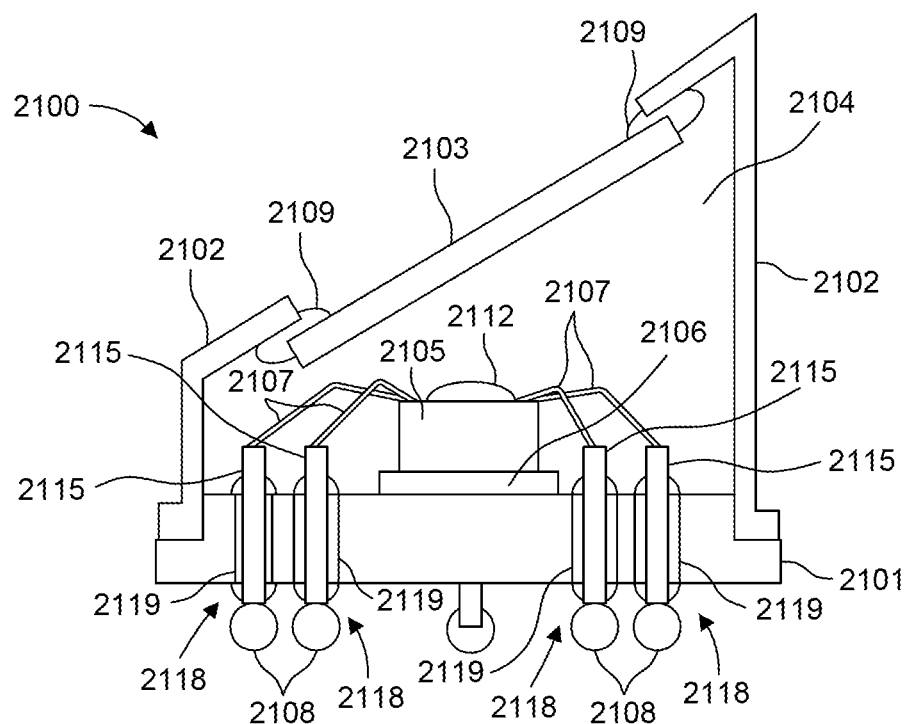
FIG. 21 shows cross-sectional view illustrating another embodiment of a package assembly according to one or more embodiments.

FIG. 21 shows cross-sectional views illustrating other types of package assemblies according to one or more embodiments.

Figure 22:
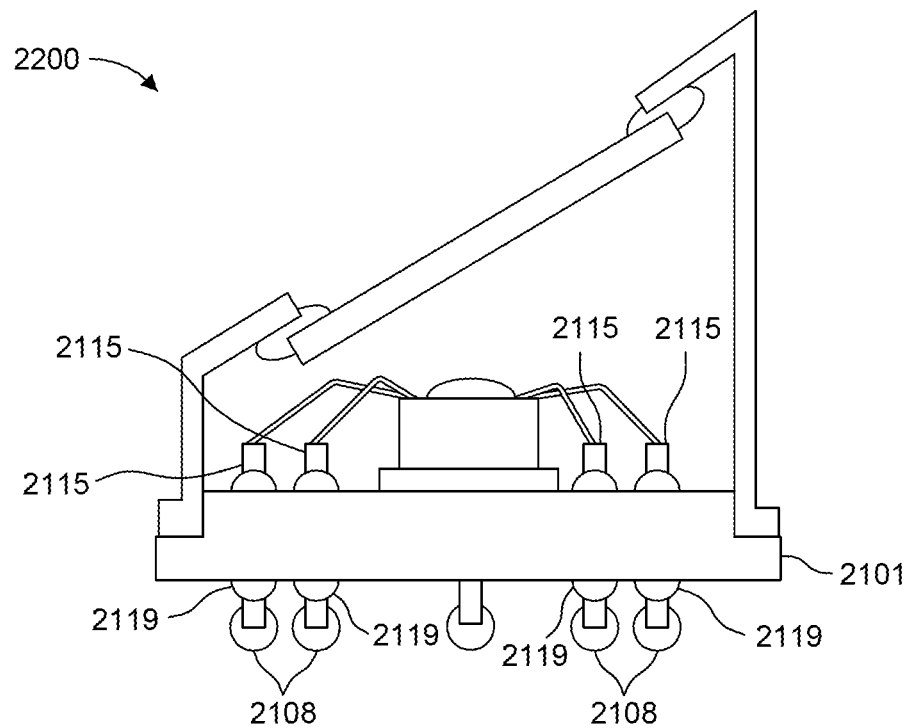
FIG. 22 shows cross-sectional view illustrating another embodiment of a package assembly according to one or more embodiments.

FIG. 22 shows cross-sectional views illustrating other types of package assemblies according to one or more embodiments.

Figure 23:
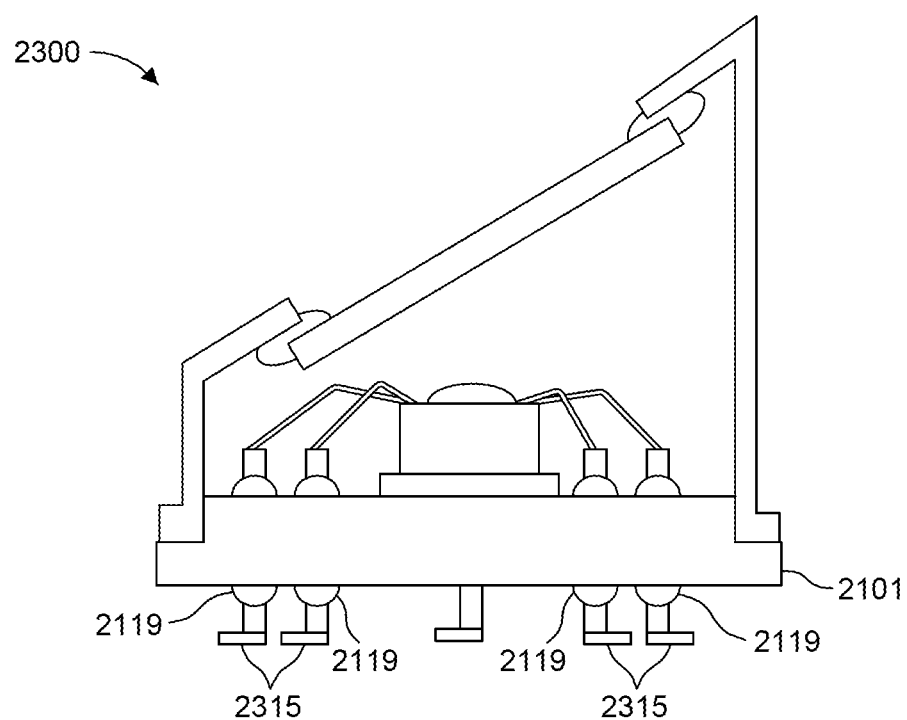
FIG. 23 shows cross-sectional view illustrating another embodiment of a package assembly according to one or more embodiments.

FIG. 23 shows cross-sectional views illustrating other types of package assemblies according to one or more embodiments.

FIG. 21 shows a cross-sectional view illustrating another embodiment of a package assembly 2100 according to one or more embodiments. The package assembly 2100 is a TO package that has similar features to those features shown in previous examples, particularly to those shown in FIG. 11.

The package assembly 2100 is a surface mount device (SMD) configured for surface mounting (e.g., to be mounted or placed directly onto the surface of a PCB). It is a full metal BGA package that is hermetically sealed, and includes a metal header base 1101 (i.e., substrate) with a metal cavity cap 1102 that is sealed onto the metal base by, for example, resistance welding. The metal header base 1101 and the metal cavity cap 1102 may be made of nickel (Ni) plated iron (Fe).

The package assembly 2100 also includes an optical window 2103, such as a glass substrate, for transmitting light therethrough. The optical window 2103 may be bonded to the metal cavity cap 2102 with glass solder 2109.

The metal header base 2101, the metal cavity cap 2102, and the optical window 2103 form a hermetically sealed cavity 2104 in which the MEMS device 2105 resides. The cavity 2104 may be filled with air having atmospheric pressure or nitrogen gas $N_2$.

The metal cavity cap 2102 has an asymmetric (e.g., wedge) shape and thereby forms the cavity 2104 that has an asymmetric shape. The metal cavity cap 2102 has an upper portion that is tilted at a tilt angle with respect to the metal header base 2101 and the MEMS device 2105 that includes a MEMS mirror 2112.

Similar to the previous examples, the package assembly 2100 also includes a die attach layer 2106 (e.g., silicon glue) and bonding wires 2107. The bonding wires 2107 are electrically coupled to the MEMS device 2105 on one end and to a metal interconnect 2115 at the other, opposing end. The metal interconnects 2115 may also be referred to as pins.

Each metal interconnect 2115 is inserted into a corresponding through-hole 2118 formed in the metal header base 2101. Each metal interconnect 2115 is coupled to a bonding wire 2107 on one end and to a solder ball 2108 at the other, opposite end. Each solder ball 2108 is disposed on a tip of a respective metal interconnect 2115 and serves as an electrical interface for surface mounting onto a PCB.

Each through-hole 2118 is filled with a sealing agent 2119 (e.g., glass solder) that secures each respective metal interconnect 2115 in place, provides isolation (i.e., isolates the metal interconnect 2115 from the metal header base 2101), and also hermetically seals the cavity 2104. Each metal interconnect 2115 may be configured, for example, by grinding, to extend a proximate distance from the metal header base 2101 to allow for surface mounting. For example, the metal interconnects 2115 may configured not extend beyond the glass solder 2119.

Furthermore, it will be appreciated that instead of a metal header base 2101, a ceramic base may be used as the substrate, in which case metallic solder may be used to bond the metal cavity cap to the substrate.

FIG. 22 shows a cross-sectional view illustrating another embodiment of a package assembly 2200 according to one or more embodiments. The package assembly 2200 is a full metal TO package that has similar features to those features shown in FIG. 21, with the exception of the arrangement of the solder balls 2108 making contact to the metal interconnects 2115. Here, in FIG. 22, each solder ball 2108 is disposed to enclose an end of a corresponding metal interconnect 2115. Thus, a corresponding metal interconnect 2115 extends into a solder ball 2018. Each solder ball 2108 serves as an electrical interface for surface mounting onto a PCB.

While not shown, the metal interconnects 2115 in FIG. 22 extend through the metal header base 2101 via through-holes in a similar manner as shown in FIG. 21.

FIG. 23 shows a cross-sectional view illustrating another embodiment of a package assembly 2300 according to one or more embodiments. The package assembly 2300 is a full metal TO package that has similar features to those features shown in FIG. 21, with the exception of the arrangement of the metal interconnects.

Instead of using solder balls for surface mounting, the package assembly 2300 implements metal interconnects 2315 that are bent at one end for surface mounting. Each metal interconnect 2315 serves as an electrical interface for surface mounting onto a PCB.

While not shown, the metal interconnects 2315 in FIG. 23 extend through the metal header base 2101 via through-holes in a similar manner as shown in FIG. 21.

Although embodiments described herein relate to a MEMS device with a mirror, it is to be understood that other implementations may include optical devices other than MEMS mirror devices. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Depending on certain implementation requirements, embodiments provided herein can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structures or any other structure suitable for implementation of the techniques described herein. In addition, in some aspects, the functionality described herein may be provided within dedicated hardware and/or software modules. Also, the techniques could be fully implemented in one or more circuits or logic elements.

The above described exemplary embodiments are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A microelectromechanical systems (MEMS) package assembly for a Light Detection and Ranging (LIDAR) system, the MEMS package assembly comprising:
   a MEMS chip including a front-side surface and a back-side surface, the MEMS chip further including a LIDAR MEMS mirror configured to receive light and reflect the light as reflected light; and
   a cavity cap disposed on the front-side surface of the MEMS chip and forms a cavity that surrounds the LIDAR MEMS mirror such that the LIDAR MEMS mirror is sealed from an environment, the cavity cap having an asymmetrical shape such that a transmission surface of the cavity cap, through which the light and the reflected light is transmitted, is tilted at a tilt angle with respect to the front-side surface of the MEMS chip.

2. The MEMS package assembly of claim 1, wherein:
   the cavity cap includes a first wall and a second wall, each having a first end that is disposed on the front-side surface of the MEMS chip, wherein an extension from the first end to a second end of the first wall is greater than an extension from the first end to a second end of the second wall, and the transmission surface extends from the second end of the first wall to the second end of the second wall at the tilt angle.

3. The MEMS package assembly of claim 2, wherein:
   the cavity cap is made of glass and is a single integral member.

4. The MEMS package assembly of claim 1, wherein:
   the LIDAR MEMS mirror is integrated at the front-side surface and is configured to rotate about a scanning axis that extends parallel to the front-side surface.

5. The MEMS package assembly of claim 1, further comprising:
   a chip carrier substrate on which the back-side surface of the MEMS chip is disposed;
   a through-hole that extends through a thickness of the chip carrier substrate;
   an electrical interface disposed on a surface of the chip carrier substrate that is opposite to the MEMS chip; and
   a conductive interconnect that is disposed in the through-hole and is electrically connected to the MEMS chip and the electrical interface.

6. The MEMS package assembly of claim 5, wherein:
   the chip carrier substrate is a redistribution layer.

7. The MEMS package assembly of claim 1, further comprising:
   a chip carrier substrate on which the back-side of the MEMS chip is disposed;
   an electrical interface disposed on a surface of the chip carrier substrate that is opposite to the MEMS chip; and a conductive interconnect that is disposed on the front-side surface of the MEMS device and is electrically connected to the MEMS chip and the electrical interface, wherein the conductive interconnect extends along a side-wall of the MEMS device from the front-side surface to the electrical interface.

8. The MEMS package assembly of claim 1, wherein the MEMS chip further comprises:
a plurality of bond pads disposed on the front-side surface at a periphery of the front-side surface,
wherein the cavity cap is disposed on the front-side surface such that the plurality of bond pads are external to the cavity.

9. The MEMS package assembly of claim 1, wherein:
the cavity cap is bonded directly to the front-side surface with an adhesive or with anodic bonding.

10. The MEMS package assembly of claim 1, further comprising:
an encapsulant disposed around a periphery of the MEMS chip and in contact with the periphery of the MEMS chip.

11. The MEMS package assembly of claim 10, further comprising:
a plurality of bonding wires, wherein the MEMS chip further comprises a plurality of bond pads disposed on the front-side surface at a periphery of the front-side surface, each bond pads being connected to a different one of the plurality of bonding wires, and
wherein the encapsulant is in contact with the plurality of bonding wires and the plurality of bond pads.

12. The MEMS package assembly of claim 10, wherein the encapsulant is one of a mold compound, a liquid epoxy, a gel, or a soft epoxy.

13. The MEMS package assembly of claim 10, wherein the encapsulant is made of silicone.

14. The MEMS package assembly of claim 10, wherein the encapsulant is further disposed around a periphery of the cavity cap and in contact with the periphery of the cavity cap, wherein the transmission surface of the cavity cap is substantially free from contact with the encapsulant.

15. The MEMS package assembly of claim 1, further comprising:
a chip carrier substrate on which the back-side of the MEMS chip is disposed;
a package body having walls that define a chip cavity in which the MEMS chip is disposed; and
an encapsulant disposed around and in contact with a periphery of the MEMS chip, wherein the encapsulant extends from the periphery of the MEMS chip to an interior side of the walls of the package body.

16. The MEMS package assembly of claim 15, further comprising:
a bond pad disposed on the front-side surface at a periphery of the front-side surface of the MEMS chip; and
a conductive interconnect electrically connected to the bond pad and that extends from inside the chip cavity through a wall of the package body.

17. A method of manufacturing a plurality of MEMS packages for at least one Light Detection and Ranging (LIDAR) system, the method of manufacturing comprising:
bonding a front-side of a MEMS wafer, comprising a plurality of MEM chips each having a LIDAR MEMS mirror exposed at the front-side of a MEMS wafer, to a glass cavity wafer to form a bonded wafer structure, wherein the glass cavity wafer has a plurality of asymmetric portions that have a transmission surface tilted at a tilt angle from a bonding surface, and each of the plurality of asymmetric portions define a cavity of a plurality of cavities, wherein the MEMS wafer and the glass cavity wafer are aligned such that each LIDAR MEMS mirror resides in a different one of the plurality of cavities; and
dicing the bonded wafer structure into the plurality of MEMS packages, each comprising one of the plurality of MEMS chips.

18. The method of manufacturing of claim 17, further comprising:
depositing a redistribution layer on a back-side of the MEMS wafer prior to dicing the bonded wafer structure.

19. The method of manufacturing of claim 18, further comprising:
forming a conductive path from the front-side of the MEMS wafer to a back-side of the redistribution layer.

20. The method of manufacturing of claim 17, wherein bonding the front-side of the MEMS wafer to the glass cavity wafer is an anodic bonding process.

21. The MEMS package assembly of claim 1, wherein:
a chip area of the MEMS chip is defined by a substrate that extends from the front-side surface and to the back-side surface,
the LIDAR MEMS mirror is integrated at the front-side surface, and
the cavity cap is coupled to the front-side surface of the MEMS chip.

* * * * *